(12) United States Patent
Awad et al.

(10) Patent No.: US 11,817,855 B2
(45) Date of Patent: Nov. 14, 2023

(54) SUPPLY VOLTAGE SELECTION DEVICE WITH CONTROLLED VOLTAGE AND CURRENT SWITCHING OPERATIONS

(71) Applicant: COMMISSARIAT A L'ENERGIE ATOMIQUE ET AUX ENERGIES ALTERNATIVES, Paris (FR)

(72) Inventors: Mohamad Awad, Grenoble (FR); Gaël Pillonnet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/838,196

(22) Filed: Jun. 11, 2022

(65) Prior Publication Data

US 2022/0399889 A1 Dec. 15, 2022

(30) Foreign Application Priority Data

Jun. 14, 2021 (FR) ...................................... 2106236

(51) Int. Cl.
| | |
|---|---|
| G05F 1/46 | (2006.01) |
| H03K 17/693 | (2006.01) |
| H03K 17/00 | (2006.01) |
| H03K 17/16 | (2006.01) |
| H03K 17/284 | (2006.01) |

(52) U.S. Cl.
CPC .............. H03K 17/693 (2013.01); G05F 1/46 (2013.01); H03K 17/002 (2013.01); H03K 17/161 (2013.01); H03K 17/284 (2013.01); H03K 2217/0081 (2013.01)

(58) Field of Classification Search
CPC .. G05F 1/59; G06F 1/263; H02J 1/082; H02J 1/084; H02J 2310/20; H03K 17/002; H03K 17/005; H03K 17/161; H03K 17/162; H03K 17/284; H03K 17/302; H03K 17/693; H03K 19/0016; H03K 2217/0081; Y02D 10/00
USPC ....................................................... 327/108
See application file for complete search history.

(56) References Cited

U.S. PATENT DOCUMENTS

| | | | |
|---|---|---|---|
| 7,254,002 B2 * | 8/2007 | Aemireddy | ............. G05F 3/262 |
| | | | 361/84 |
| 8,018,093 B2 * | 9/2011 | Miermont | ............. G06F 1/3296 |
| | | | 327/540 |
| 10,432,184 B1 | 10/2019 | Choi et al. | |
| 10,439,602 B2 | 10/2019 | Beeston et al. | |
| 2005/0057952 A1 | 3/2005 | Mayega et al. | |

(Continued)

FOREIGN PATENT DOCUMENTS

| | | |
|---|---|---|
| CN | 106 873 696 A | 6/2017 |
| EP | 1 993 019 A1 | 11/2008 |

(Continued)

*Primary Examiner* — Thomas J. Hiltunen
(74) *Attorney, Agent, or Firm* — BakerHostetler

(57) ABSTRACT

A selection circuit architecture makes it possible to perform upward and/or downward transitions in sets of sequences of slow and fast phases so as at the same time to solve the problems of inductive switching noise and the problems of currents in the supply rails. This solution has multiple advantages linked to the ease of implementation and flexibility of configurations that are possible for adapting to the specific constraints when designing the circuit.

13 Claims, 13 Drawing Sheets

(56) References Cited

U.S. PATENT DOCUMENTS

2015/0108842 A1* 4/2015 Chen .................... H02J 1/10
                                                    307/52
2018/0012635 A1* 1/2018 Quelen ................. H02J 1/10

FOREIGN PATENT DOCUMENTS

EP      3 267 583 A1    1/2018
EP      3 734 398 A1    11/2020

* cited by examiner

SUPPLY VOLTAGE SELECTION DEVICE WITH CONTROLLED VOLTAGE AND CURRENT SWITCHING OPERATIONS

CROSS-REFERENCE TO RELATED APPLICATION

This application claims priority to foreign French patent application No. FR 2106236, filed on Jun. 14, 2021, the disclosure of which is incorporated by reference in its entirety.

FIELD OF THE INVENTION

The present invention relates to the field of electronic circuits with multiple supply voltages, and more particularly to a supply voltage selection circuit for a multicore integrated circuit.

BACKGROUND

In some electronic devices, it is desirable to be able to modify the level of the supply voltage of an integrated circuit, for example in order to optimize the management of electrical energy in the device. This modification of the level of the supply voltage should preferably be able to be performed dynamically, without interrupting the operation of the integrated circuit.

More particularly, dynamic management of the level of the supply voltage is essential in the case of high-performance computing (HPC) circuits. New high-performance computing processor architectures are generally divided into multiple cores. Reference is made in this case to multicore processors.

FIG. 1$a$ illustrates a diagram of one example of an electronic circuit comprising a plurality of cores with supply voltage management. The example comprises three supply voltage sources by way of illustration and without limitation.

The electronic circuit that is illustrated is a multicore processor PROC comprising a plurality of supply voltage sources VDDH VDDM and VDDL such that VDDH<VDDM<VDDL; N computing cores CORE$^1$ and M supply voltage selector circuits VSi, where N is a natural integer greater than 1 and i is a natural integer from 1 to N and where M is a natural integer greater than 1 and j is a natural integer from 1 to M. Each voltage selector circuit VSj is configured so as to supply a supply voltage chosen from among VDDH VDDM VDDL to at least one computing core COREi.

The cores CORE operate at different frequencies. The workloads at the output of each core COREi change dynamically when performing computations. For each core COREi, the supply voltage defines the computing power and the energy cost of logic operations. Specifically, a computing core operating at full computing power should be supplied with the maximum voltage VDDH; a computing core operating during medium computing activity may be supplied with the medium voltage VDDM; and a computing core in standby requires only the minimum voltage VDDL. The number of computing operations to be performed and the algorithmic process used by each core COREi thus define the required computing means and thus the required supply voltage for said core in real time. Upon a change in activity of a core COREi, the supply voltage of said core should be adjusted in order to minimize the product of computing time and energy consumption; this technique is called dynamic voltage scaling. It is particularly beneficial not to interrupt the activity of the core during transitions between two supply levels. The voltage selector circuits VSj make it possible to implement dynamic management of the supply voltage for a large number N of cores COREi (N>10).

In the architecture that is presented, the N computing cores COREi and M supply voltage selector circuits VSj are implemented on the same IC chip and the supply voltage sources VDDH VDDM and VDDL are external to the IC chip. The supply voltages VDDH VDDM and VDDL are respectively propagated to the IC chip via the common supply rails RH, RM and RL. The common supply rails, since they are produced using conductive materials, always exhibit parasitic inductive effects (or self-induction), shown here by the parasitic inductances LH, LM and LL. Upon a transition from one supply voltage to another, the parasitic inductances linked to the sources of the supply voltages experience a large current variation within a brief time period, thereby generating a voltage variation across the terminals of the inductance, and therefore on the supply rails. Reference is made here to L.di/dt "switching noise". This type of noise, during the transitions, disrupts the supply voltage levels of the various computing cores COREi, and therefore disrupts the operation of the whole electronic circuit PROC. There is therefore a non-negligible inductive effect that electrically couples the cores that are connected to the same common rail. During the transitions, the almost instantaneous variation in the current on the common rails is reflected by a voltage variation on the common rails. This disruption will have a knock-on effect on all of the cores supplied thereby and therefore modify the operation of these cores.

The supply disruption experienced by a computing core generates computing errors. Specifically, the operating frequency of a core was designed to be compatible with an a priori fixed supply voltage value. Disruptions due to the self-induction phenomenon will thus create incompatibility between the supply voltage and the operating frequency of the computing core.

FIG. 1$b$ illustrates the problem of switching noise caused by parasitic intrinsic inductances upon one or more changes of supply voltage in a multicore circuit with dynamic voltage scaling. The timing diagram 1$c$.1 illustrates the temporal variation of the voltage VCORE1 supplied to the computing core CORE1 chosen by the voltage selection circuit VS1.

The timing diagram 1$c$.2 illustrates the temporal variation of the voltage VCORE2 supplied to the computing core CORE2 chosen by the voltage selection circuit VS2. The timing diagram 1$c$.3 illustrates, more generally, the temporal variation of the voltage VCOREn supplied to any computing core COREn chosen by the associated voltage selection circuit VSn.

At t1, the voltage VCORE1 is configured so as to remain constant at the medium voltage level VDDM, the voltage VCORE2 is configured so as to transition down from the high voltage level VDDH to the medium voltage level VDDM, and the voltage VCOREN is configured so as to transition up from the low voltage level VDDL to the medium voltage level VDDM. Sudden and simultaneous switching operations cause large inrush currents in the parasitic inductances LM, LL and LH within a short time interval. The transitions performed to change the supply of the core CORE2 and of the core COREN thus disrupt the common rail RM of the medium supply voltage level VDDM. This disruption is noticeable on all of the power supply nodes VCORE1 VCORE2 up to VCOREN. By way of example, a disruption is observed in the form of a voltage drop (or power drop) on the power supply node VCORE1, which is normally configured so as to remain constant at the medium voltage level VDDM. Eliminating the disruption from the transition of the supply level of a core on those of the other cores through inductive coupling of the common rails thus requires the transitions between two supply levels to be controlled in terms of voltage, but also in terms of current. It is considered that a supply voltage is "not disrupted" when the variations in this voltage are less than 5% of the targeted voltage level.

Moreover, it is not conceivable to make do with moderating the transition slope upon the switch from one supply level to another level in order to limit switching noise. Specifically, this approach exhibits another risk for the circuit, consisting in the occurrence of reverse currents in the common supply rails, thereby disrupting the correct operation of the electronic circuit PROC.

To sum up, it has been demonstrated that: on the one hand, sudden current variations in the supply rails upon a transition from one supply voltage level to another generate switching noise due to the parasitic inductive effect. On the other hand, the reverse current phenomenon exhibits a technical constraint that limits the approach of moderating the transition slope.

The technical problem to be solved is then that of developing supply voltage selection circuits that allow dynamic voltage scaling while at the same time limiting switching noise due to the parasitic inductive effect of the common supply rails and while avoiding the phenomenon of reverse currents in said common rails.

European patent EP3267583B1 proposes a supply voltage selection circuit architecture that makes it possible to control the shape of the voltage on the supply rail of a computing core circuit during the transition from one supply voltage level to another level. The drawback of the solution proposed by the abovementioned patent is that it is limited to voltage control and does not take into account large inrush currents on each common rail. Current variations are not controlled and the problem of switching noise resulting from parasitic inductances is not solved.

U.S. Pat. No. 10,439,602B2 proposes a supply voltage selection circuit architecture that makes it possible to switch between two supply rails, one main and one auxiliary, depending on the available voltage. If the main voltage becomes smaller than a defined threshold, the auxiliary voltage is used to regulate the output voltage and to return it to the desired level. The drawback of the solution proposed by the abovementioned patent is that the solution requires the power switches of the main and auxiliary source to be kept simultaneously in the on state in order to work. This leads to reverse currents in the circuit that reduce the computing performance and energy efficiency of the circuit. In addition, the solution proposed by the abovementioned patent requires implementing four comparators in order to detect the states of the two rails and continuous operation of at least two comparators. This considerably increases the energy consumption of the supply voltage selection circuit.

U.S. Pat. No. 10,432,184B1 proposes a supply voltage selection circuit architecture comprising a current multiplexer that makes it possible to perform soft transitions in order to limit inrush currents. The drawback of the solution proposed by the abovementioned patent is that it requires implementing a capacitive element having a large capacitance. This leads to a considerable increase in the surface area occupied by the device in its entirety and then poses physical integration constraints. In addition, the solution proposed by the patent discloses very long transition times, making it incompatible with applications operating at high frequency.

European patent application EP3734398A1 proposes a supply voltage selection circuit architecture using a single supply rail at input, making it possible to simultaneously provide a main voltage and a configurable voltage. The drawback of the solution proposed by the abovementioned patent is that it requires continuous operation of a comparator, thereby considerably increasing the energy consumption of the supply voltage selection circuit. In addition, the solution in the patent application does not take into account large inrush currents on each common rail. Current variations are not controlled and the problem of switching noise due to parasitic inductances is not solved.

In order to overcome the limitations of the existing solutions with regard to allowing dynamic voltage scaling while at the same time limiting supply inductive switching noise and while avoiding the phenomenon of reverse currents, the invention proposes various embodiments of a selection circuit architecture that makes it possible to perform upward and/or downward transitions in sets of sequences of slow and fast phases so as at the same time to solve the problems of inductive switching noise and the problems of currents in the supply rails. This solution has multiple advantages linked to the ease of implementation and flexibility of configurations that are possible for adapting to the specific constraints when designing the circuit.

SUMMARY OF THE INVENTION

The subject of the invention is a circuit for selecting a supply voltage, comprising:
a first node designed to receive a first input supply voltage;
a second node designed to receive a second input supply voltage less than the first input supply voltage;
a third node designed to supply an output supply voltage;
a first power transistor connecting the first node to the third node;
a second power transistor connecting the second node to the third node;
and a configuration circuit designed, in a first configuration, to keep the first and second transistors respectively in the on state and in the off state so as to apply the first input supply voltage to the third node and, in a second configuration, to keep the first and second transistors respectively in the off state and in the on state so as to apply the second input supply voltage to the third node;
a transition phase from the first configuration to the second configuration being called downward transition;
a transition phase from the second configuration to the first configuration being called upward transition;
the configuration circuit comprising:
a first transition management circuit configured so as to control the gate of the first transistor upon the upward or downward transition so as to apply, to the third node:
at least one first voltage ramp having a first slope for a first duration defining a slow phase;
and a second voltage ramp having a second slope, greater than the first slope, for a second duration defining a fast phase,
a second transition management circuit configured so as to control the gate of the second transistor upon the upward or downward transition so as to apply a control signal having a gradual variation.

According to one particular aspect of the invention, the absolute value of the first slope is between one tenth of the absolute value of the second slope and one fifth of the absolute value of the second slope.

According to one particular aspect of the invention, the configuration circuit, to perform an upward transition, is configured so as to successively execute the following steps:
- i controlling the first transistor in linear regime so as to apply the first voltage ramp to the third node during the slow phase;
- ii detecting the change of the output supply voltage to a level greater than a predetermined threshold less than the first input supply voltage, said change indicating the end of the slow phase;
- iii controlling the first transistor in linear regime so as to apply a constant voltage to the third node during an intermediate phase between the slow phase and the fast phase;
- iv and applying, during the intermediate phase, a control signal having a gradual variation to the gate of the second transistor so as to gradually switch the second transistor to an off state;
- v controlling the first transistor in linear regime so as to apply the second voltage ramp to the third node during the fast phase until the first transistor changes to an on state.

According to one particular aspect of the invention, the configuration circuit, to perform a downward transition, is configured so as to successively execute the following steps:
- i controlling the first transistor in linear regime so as to apply the second voltage ramp to the third node during the fast phase;
- ii detecting the change of the output supply voltage to a level greater than a level lower than a predetermined threshold greater than the second input supply voltage, said change indicating the end of the fast phase;
- iii applying, during the slow phase, a control signal having a gradual variation to the gate of the second transistor so as to gradually switch the second transistor to an on state;
- iv and controlling the first transistor in linear regime so as to apply the first voltage ramp to the third node during the slow phase until the first transistor changes to an off state.

According to one particular aspect of the invention, the configuration circuit, to perform an upward transition, is configured so as to successively execute the following steps:
- i applying a second control signal having a gradual variation to the gate of the first transistor during the slow phase;
- ii detecting the change of the output supply voltage to a level greater than a predetermined threshold less than the first input supply voltage, said change indicating the end of the slow phase;
- iii controlling the first transistor in linear regime so as to apply a constant voltage to the third node during an intermediate phase between the slow phase and the fast phase;
- iv and applying, during the intermediate phase, a control signal having a gradual variation to the gate of the second transistor so as to gradually switch the second transistor to an off state;
- v controlling the first transistor in linear regime so as to apply the second voltage ramp to the third node during the fast phase until the first transistor changes to an on state.

According to one particular aspect of the invention, the configuration circuit, to perform a downward transition, is configured so as to successively execute the following steps:
- i controlling the first transistor in linear regime so as to apply the second voltage ramp to the third node during the fast phase;
- ii detecting the change of the output supply voltage to a level greater than a level lower than a predetermined threshold greater than the second input supply voltage, said change indicating the end of the fast phase;
- iii applying, during the slow phase, a first control signal having a gradual variation to the gate of the second transistor so as to gradually switch the second transistor to an on state;
- iv and applying a second control signal having a gradual variation to the gate of the first transistor so as to apply the first voltage ramp to the third node during the slow phase; so as to gradually switch the first transistor to an off state.

According to one particular aspect of the invention, the control circuit comprises:
- a voltage ramp generator for generating:
- the first upward or downward voltage ramp,
- and/or the second upward or downward voltage ramp on an output node.
- and wherein the first transition management circuit comprises a first linear regulation circuit for controlling the first transistor in linear regime, and having:
- a first input node connected to the third node,
- a second input node connected to the output node of the ramp generator,
- and an output node connected to the gate of the first transistor via a first switch.

According to one particular aspect of the invention, the first linear regulation circuit is configured so as to control the first transistor in linear regime by slaving the output supply voltage to the voltage ramp applied to the second input node when the first switch is in the on state.

According to one particular aspect of the invention, the first transition management circuit furthermore comprises a first gradual transition circuit having an output node connected to the gate of the first transistor via a second switch, the first gradual transition circuit being able to apply a control signal having a gradual variation to the gate of the second transistor when the second switch is in the on state.

According to one particular aspect of the invention, the configuration circuit furthermore comprises a second transition management circuit comprising:
- a second linear regulation circuit having:
- a first input node connected to the third node,
- a second input node connected to the output node of the ramp generator,
- and an output node connected to the gate of the second transistor via a third switch.

According to one particular aspect of the invention, the second transition management circuit comprises a second gradual transition circuit having an output node connected to the gate of the second transistor via a fourth switch, said gradual transition circuit being able to apply a control signal to the gate of the second transistor when the third switch is in the on state; said control signal having an increasing or decreasing gradual variation.

According to one particular aspect of the invention, the configuration circuit furthermore comprises a circuit for comparing the output supply voltage to a predetermined threshold.

According to one particular aspect of the invention, the configuration circuit furthermore comprises a circuit for generating a predetermined duration.

BRIEF DESCRIPTION OF THE DRAWINGS

Other features and advantages of the present invention will become more clearly apparent upon reading the following description with reference to the following appended drawings.

FIG. 1b illustrates switching noise due to intrinsic inductances in the example of an electronic circuit from FIG. 1a.

DETAILED DESCRIPTION

Figure 1A:
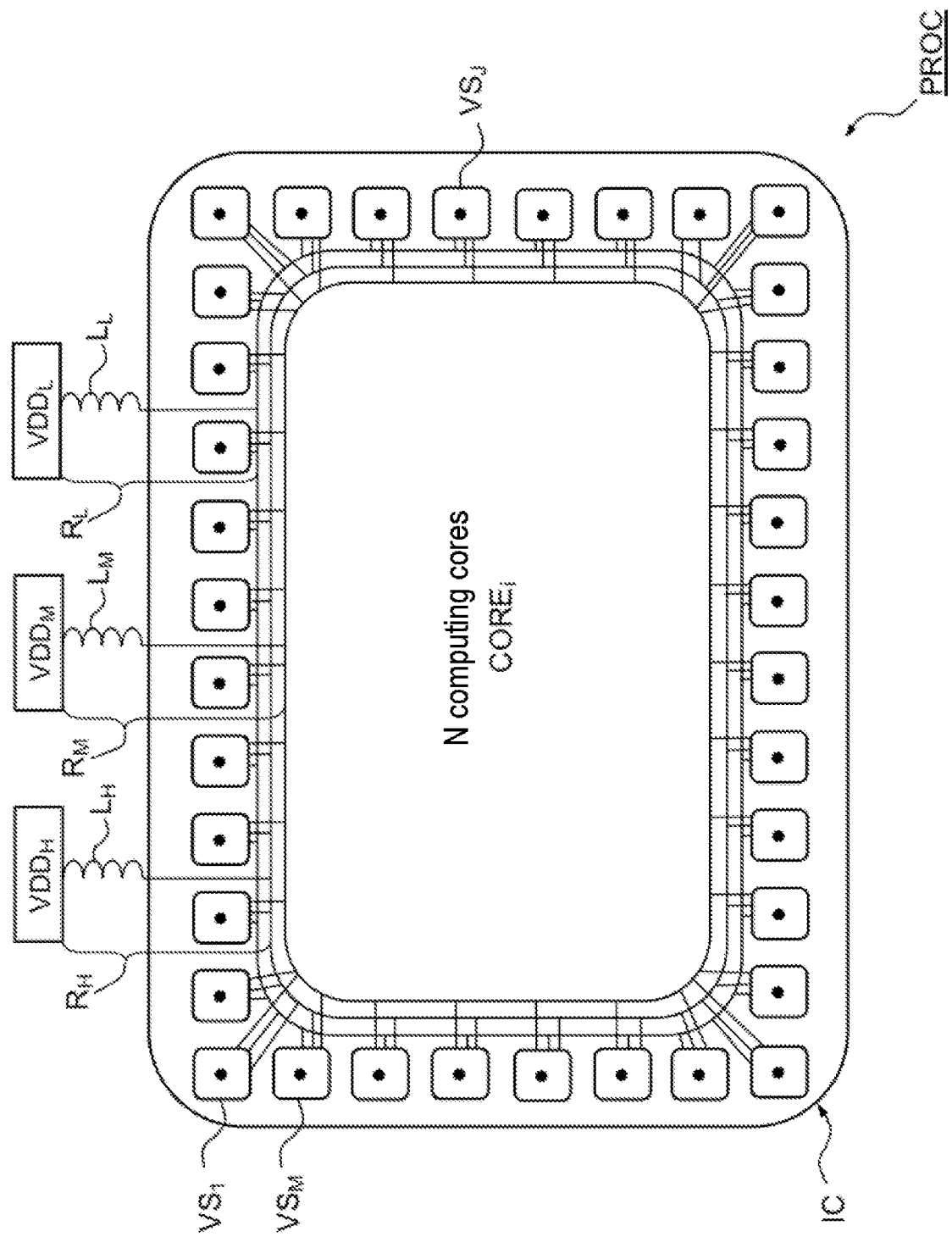
FIG. 1a illustrates a diagram of one example of an electronic circuit comprising a plurality of cores with supply voltage management.
Figure 1B:
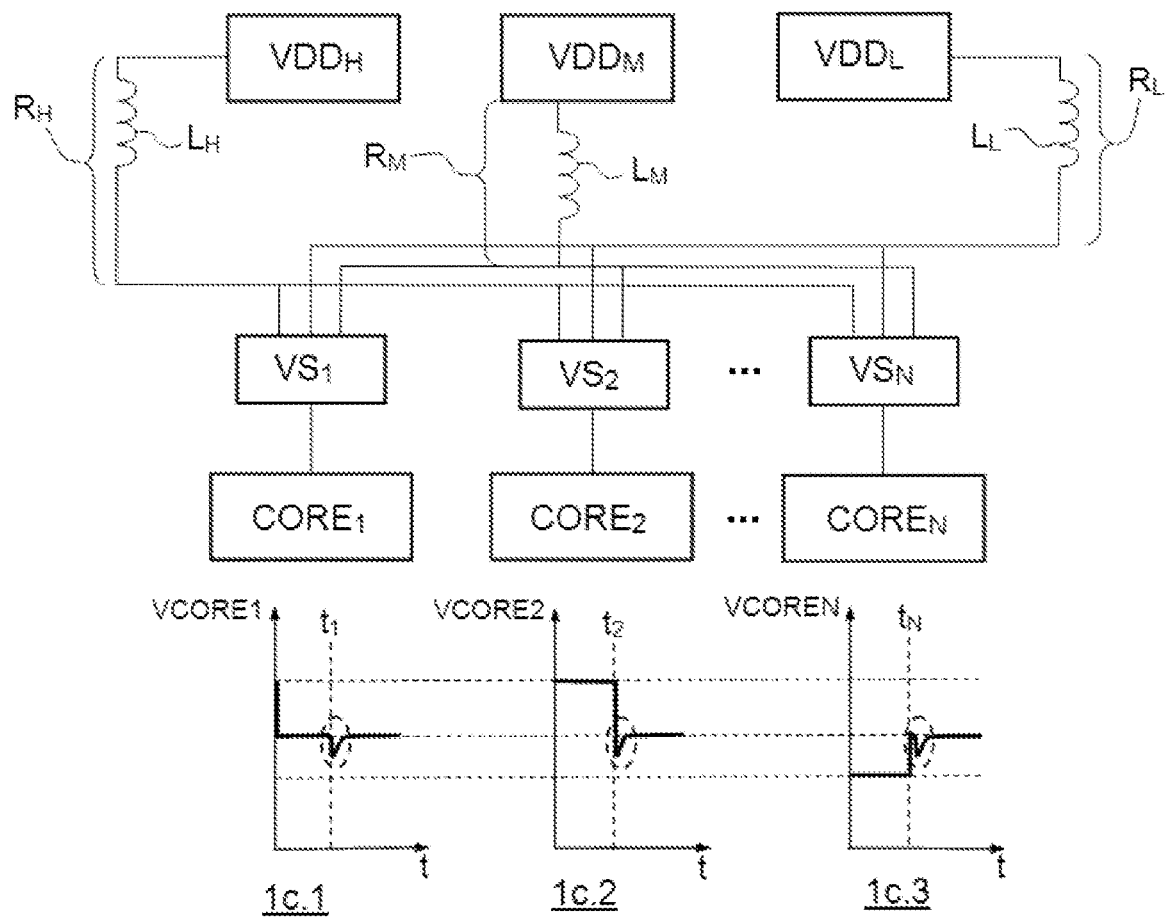
Figure 2A:
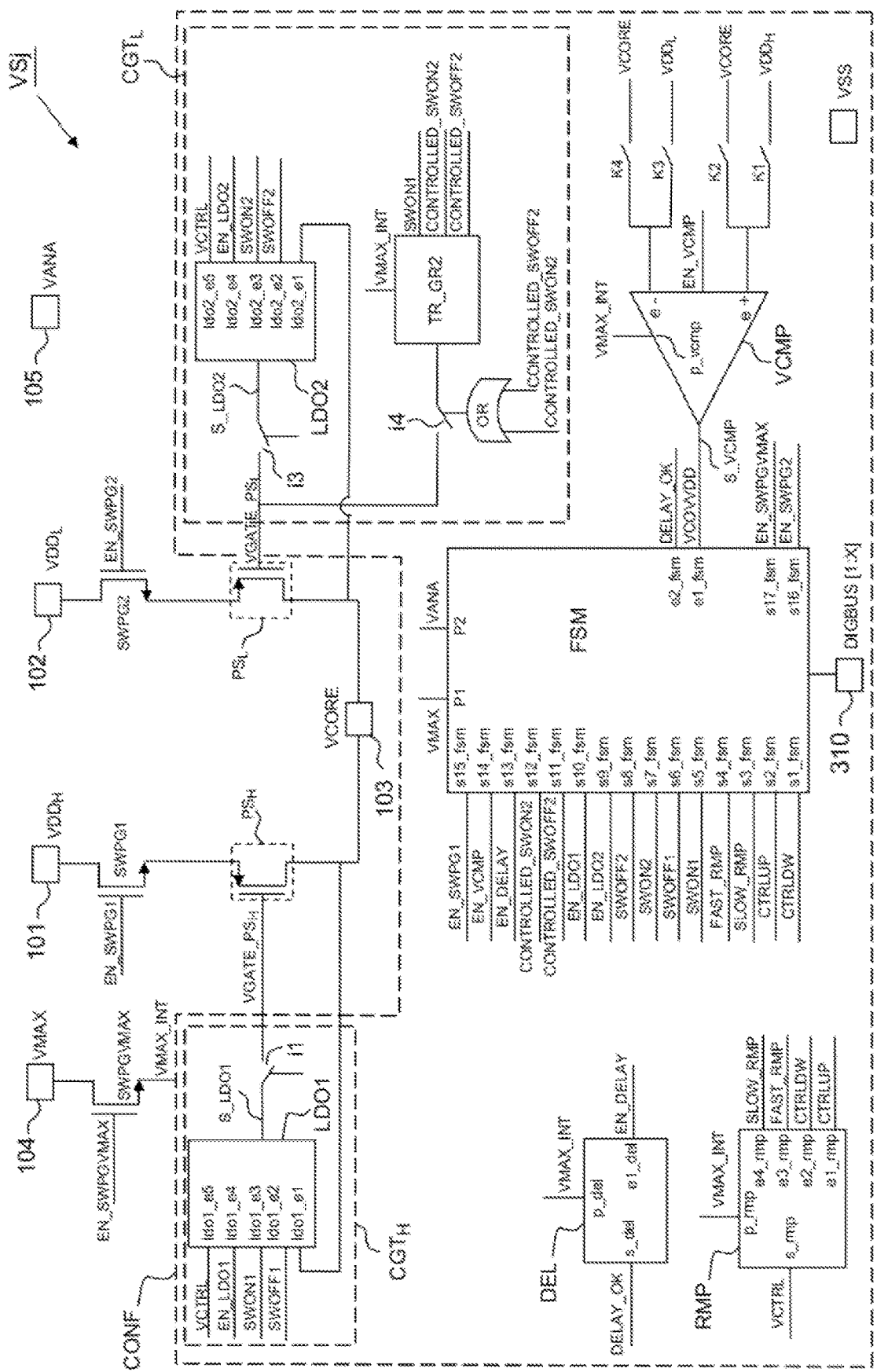
FIG. 2a illustrates an electronic circuit for selecting a supply voltage according to a first embodiment of the invention.

FIG. 2a illustrates an electronic circuit for selecting a supply voltage Vsj according to a first embodiment of the invention. The circuit for selecting a supply voltage VSj of rank j supplies the computing core COREj of the same rank j (not shown) with the supply voltage chosen according to the resource requirements of the core, as explained above. Without loss of generality and for the sake of simplicity, we will limit ourselves to the illustration of the invention with two possible supply voltage levels: VDDH for the high supply voltage and VDDL for the low supply voltage. The features of the invention remain generally applicable to a plurality of supply voltage levels.

The circuit for selecting a supply voltage VSj comprises a first node 101 designed to receive a first input supply voltage VDDH; a second node 102 designed to receive a second input supply voltage VDDL less than the first supply voltage VDDH; a third node 103 designed to supply an output supply voltage VCORE to the associated computing core.

In addition, the circuit for selecting a supply voltage VSj comprises a first power transistor PSH connecting the first node 101 to the third node 103; a second power transistor PSL connecting the second node 102 to the third node 103. In the example illustrated, the power transistors are PMOS transistors. It is also possible to use NMOS transistors while adapting the control signals to this type of transistor.

In addition, the circuit for selecting a supply voltage VSj comprises a configuration circuit CONF designed, in a first configuration, to keep the first and second transistors PSH and PSL respectively in an on state and in an off state (or blocked) so as to apply the first input supply voltage VDDH to the third node 103. In a second configuration, the configuration circuit CONF is designed to keep the first and second transistors PSH and PSL respectively in the off state and in the on state so as to apply the second input supply voltage VDDL to the third node 103.

The circuit for selecting a supply voltage VSj furthermore comprises a fourth node 104 designed to receive a third supply voltage VMAX equal to the maximum supply voltage VDDH and used to power the operation of part or all of the configuration circuit CONF.

Advantageously, the source of the PMOS transistor PSL is not connected directly to the node 102, but via an NMOS transistor denoted SWPG2 having a resistivity, in the off state, greater than that of PSL, and thus making it possible to reduce leakage currents via the node 102. This is achieved by putting the transistor SWPG2 into an off state via the signal EN_SWPG2 when the transistor PSL is in an off state. Likewise, the source of the PMOS transistor PSH is not connected directly to the node 101, but via an NMOS transistor denoted SWPG1 having a resistivity greater than that of PSH and thus making it possible to reduce leakage currents via the node 101 when VDDH is not selected. This is achieved by putting the transistor SWPG1 into an off state via the signal EN_SWPG1 when the transistor PSH is in an off state. Likewise, the configuration circuit CONF is not connected directly to the node 104, but via an NMOS transistor denoted SWPGVMAX having a resistivity greater than the transistors of the sub-blocks of the configuration circuit CONF and thus making it possible to reduce leakage currents via the node 104. The configuration circuit CONF is thus powered with the voltage VMAX_INT at the drain of the intermediate transistor SWPGVMAX. The leakage currents are in this case limited by putting the transistor SWPGVMAX into an off state via the signal EN_SWPGVMAX when the configuration circuit is deactivated. By way of example, the current leakage-limiting transistors SWPG1, SWPG2 and SWPGVMAX are transistors having a gate produced with an oxide layer thicker than that of the transistors PSH and PSL so as to achieve a higher resistivity for the current leakage-limiting transistors.

In addition, the circuit for selecting a supply voltage VSj furthermore comprises a fifth node 105 designed to receive a fourth supply voltage VANA greater than the maximum supply voltage VDDH and used to power the operation of part or all of the configuration circuit CONF and control the transistors for the current leakage-limiting transistors.

More particularly, the configuration circuit CONF comprises the following sub-blocks: a first transition management circuit CGTH, a second transition management circuit CGTL, a comparator COMP, an upward or downward voltage ramp generation circuit RMP, a delay generation circuit DEL and an asynchronous sequencing circuit FSM implementing a previously programmed state machine.

The first transition management circuit CGTH is configured so as to control the gate of the first transistor PSH upon the upward or downward transition so as to apply, to the third node 103:

- at least one first voltage ramp having a first slope for a first duration defining a slow phase;
- and a second voltage ramp having a second slope, greater than the first slope, for a second duration defining a fast phase.

The first transition management circuit CGTH comprises a first linear regulation circuit LDO1 for controlling the first transistor PSH in linear regime, and having a first input node Ido1_e1 connected to the third node 103, a second input node Ido1_e5 connected to the output node s_rmp of the ramp generator RMP, and an output node Ido1_s connected to the gate of the first transistor PSH via a first switch i1. The first linear regulation circuit LDO1 forms an analogue feedback loop designed to control the transistor PSH in linear regime so as to control the output supply voltage VCORE supplied to the node 103. In the example shown, the regulation circuit LDO1 comprises an input node Ido1_e5 for receiving a voltage ramp VCTRL to be transferred to the node 103. The circuit LDO1 is able to adjust the control signal applied, via its node Ido1_s, to the gate of the transistor PSH (corresponding to VGATE_PSH when the switch i1 is in the on state). This makes it possible to slave the output supply voltage VCORE to the voltage ramp VCTRL.

In this example, the regulation circuit LDO1 furthermore comprises an input node Ido1_e4 for receiving an activation signal EN_LDO1 from the circuit LDO1. It furthermore comprises an input node Ido1_e3 for receiving a signal SWON1 for keeping the transistor PSH in the closed state (on state) following an upward transition, and an input node Ido1_e2 for receiving a signal SWOFF1 for keeping the transistor PSH in the open state (off state) following a downward transition. The regulation circuit LDO1 furthermore comprises a power supply node Ido1_p connected to the node for supplying the internal supply voltage VMAX INT.

The second transition management circuit CGTL is configured so as to control the gate of the second transistor PSL upon the upward or downward transition when the switch i3 is in the on state so as to apply a control signal VGATE_PSL having a gradual variation. By way of example, a gradual voltage variation is a variation over time that may be modeled using a logarithmic law ln(x), a linear law with a slow slope (<1 V/μs absolute value) or an exponential law exp(−x), where x>0.

In the example illustrated, the second transition management circuit CGTL comprises a gradual transition circuit denoted TR_GR2, able to perform the function of gradually controlling the transistor PSL via a switch i4. The switch i4 is closed when at least one of the signals CONTROLLED_SWOFF2 or CONTROLLED_SWON2 is activated. To control the switch i4, a logic cell performing the "OR" function is used. To achieve the gradual variation on the node VGATE_PSL, it is possible to use a resistor or a capacitive element.

Advantageously, the second transition management circuit CGTL comprises a second linear regulation circuit LDO2 for controlling the second transistor PSL in linear regime during the upward and downward transitions between VDDL and electrical ground when the core COREj associated with the selection circuit VSj is put into standby.

The second linear regulation circuit LDO2 has a first input node Ido2_e1 connected to the third node 103, a second input node Ido2_e5 connected to the output node s_rmp of the ramp generator RMP, and an output node Ido2_s connected to the gate of the second transistor PSL via a controlled switch i3. The second linear regulation circuit LDO2 forms an analogue feedback loop designed to control the transistor PSL in linear regime in order to control the output supply voltage VCORE supplied to the node 103. In the example shown, the regulation circuit LDO2 comprises an input node Ido2_e5 for receiving a voltage ramp VCTRL to be transferred to the node 103 when it is activated by the signal EN_LDO2. The circuit LDO2 is able to adjust the control signal applied, via its node Ido2_s, to the gate of the transistor PSH (corresponding to VGATE_PSL when the switch i3 is in the on state). This makes it possible to slave the output supply voltage VCORE to the voltage ramp VCTRL.

In this example, the regulation circuit LDO2 furthermore comprises an input node Ido2_e4 for receiving the activation signal EN_LDO2 from the circuit LDO2. It furthermore comprises an input node Ido2_e3 for receiving a signal SWON2 for keeping the transistor PSL in the closed state (on state) following a downward transition, and an input node Ido2_e2 for receiving a signal SWOFF2 for keeping the transistor PSL in the open state (off state) following an upward transition. The regulation circuit LDO2 furthermore comprises a power supply node Ido2_p connected to the node for supplying the internal supply voltage VMAX INT.

The ramp generation circuit RMP comprises an output node s_rmp connected to the input nodes Ido1_e5 and Ido2_e5 of the linear regulation circuits LDO1 and LDO2 and supplying the voltage ramp VCTRL applied to the circuits LDO1 and LDO2. In the example shown, the circuit RMP comprises an input node e1_rmp intended to receive a control signal CTRLUP and an input node e2_rmp intended to receive a control signal CTRLDW. When the control signal CTRLUP is activated, the circuit RMP is configured so as to generate, on its output node s_rmp, a predetermined increasing voltage ramp. When the control signal CTRLDW is activated, the circuit RMP is configured so as to generate, on its output node s_rmp, a predetermined decreasing voltage ramp. The circuit RMP furthermore comprises an input node e3_rmp intended to receive a control signal FAST_RMP and an input node e4_rmp intended to receive a control signal SLOW_RMP. When the control signal SLOW_RMP is activated, the circuit RMP is configured so as to generate, on its output node s_rmp, a voltage ramp having a first predetermined slope in order to obtain a slow ramp. When the control signal FAST_RMP is activated, the circuit RMP is configured so as to generate, on its output node s_rmp, a voltage ramp having a second slope, significantly less in terms of absolute value than the first slope, in order to obtain a fast ramp. By way of illustration, a slow ramp has an increasing or decreasing slope less in terms of absolute value than 1 V/μs. For the fast ramp, the absolute value of the second slope is between 5 and 10 times the absolute value of the slow slope. In addition, the circuit RMP comprises a power supply node p_rmp connected to the node for supplying the internal supply voltage VMAX_INT. The implementation of the voltage ramp generation circuit RMP has not been detailed, since the embodiments that are described are compatible with all or most known voltage ramp generation circuits.

The delay generation circuit DEL comprises an input node e1_del intended to receive an activation signal EN_DELAY, and an output node s_del. The circuit DEL is intended to supply, on its output node s_del, a signal DELAY_OK having a pulse after a predetermined delay. More particularly, the circuit DEL is intended to reproduce, on its output s_del, with a predetermined delay, a state change of the signal DELAY_OK applied to its input node e1_del. In addition, the circuit DEL furthermore comprises a power supply node p for supplying power to the node for supplying the internal supply voltage VMAX_INT. The implementation of the delay generation circuit DEL has not been detailed, since the embodiments that are described are compatible with all or most known delay generation circuits.

The voltage comparator VCMP has a first input terminal e− and a second input terminal e+. The first input terminal e− is connected, on the one hand, to the node 103 for applying the output supply voltage VCORE by way of a switch K4, and, on the other hand, to the node 102 for applying the low input supply voltage VDDL by way of a switch K3. +. The second input terminal e+ is connected, on the one hand, to the node 103 for applying the output supply voltage VCORE by way of a switch K2, and, on the other hand, to the node 101 for applying the low input supply voltage VDDH by way of a switch K1. The voltage comparator VCMP comprises an output node s_cmp and it is intended to supply, to this node s_cmp, a voltage VCOVVDD that changes level when the voltage applied to its input node e+ reaches a predetermined threshold dependent on that of the voltage applied to its input node e−. When the switches K4 and K1 are closed (on state), and the switches K3 and K2 are open (off state), the comparator VCMP compares the output supply voltage VCORE to a first threshold Vthreshold1 equal to VDDL+ΔV, where ΔV>0. When the switches K4 and K1 are open (off state), and the switches K3 and K2 are closed (on state), the comparator VCMP compares the output supply voltage VCORE to a second threshold Vthreshold2 equal to VDDH−ΔV, where ΔV>0. The comparator VCMP thus makes it possible to detect the change of the output supply voltage VCORE to a value less than the first threshold Vthreshold1=VDDL+ΔV, but also to detect the change of the output supply voltage VCORE to a value greater than the second threshold Vthreshold2=VDDH−ΔV depending on the configuration of the switches K1, K2, K3 and K4. The voltage comparator VCMP furthermore comprises a power supply node p connected to the node for supplying the internal supply voltage VMAX_INT. The implementation of the voltage comparison circuit VCMP has not been detailed, since the embodiments that are described are compatible with all or most known voltage comparison circuits.

In this example, the (clock-free) asynchronous sequencing circuit FSM implements a finite state machine. The sequencing circuit FSM comprises:

an output node s1_fsm connected to the input node e2_rmp of the ramp generator RMP in order to supply the control signal CTRLDW;

an output node s2_fsm connected to the input node e1_rmp of the ramp generator RMP in order to supply the control signal CTRLUP;

an output node s3_fsm connected to the input node e4_rmp of the ramp generator RMP in order to supply the control signal SLOW_RMP;

an output node s4_fsm connected to the input node e3_rmp of the ramp generator RMP in order to supply the control signal FAST_RMP;

an output node s5_fsm connected to the input node Ido1_e3 of the linear regulation circuit LDO1 in order to supply the control signal SWON1;

an output node s6_fsm connected to the input node Ido1_e2 of the linear regulation circuit LDO1 in order to supply the control signal SWOFF1;

an output node s7_fsm connected to the input node Ido2_e3 of the linear regulation circuit LDO2 in order to supply the control signal SWON2;

an output node s8_fsm connected to the input node Ido2_e2 of the linear regulation circuit LDO2 in order to supply the control signal SWOFF2;

an output node s9_fsm connected to the input node Ido2_e4 of the linear regulation circuit LDO2 in order to supply the control signal EN_LDO2 and to the switch i3;

an output node s10_fsm connected to the input node Ido1_e4 of the linear regulation circuit LDO1 in order to supply the control signal EN_LDO1;

an output node s11_fsm connected to the input node tr2_e1 of the gradual transition circuit TR_GR2 in order to supply the control signal CONTROLLED_SWOFF2;

an output node s12_fsm connected to the input node tr2_e2 of the gradual transition circuit TR_GR2 in order to supply the control signal CONTROLLED_SWON2;

an output node s13_fsm connected to the input node e1_del of the delay generator circuit DEL in order to supply the control signal EN_DELAY;

an output node s14_fsm connected to the input node e1_cmp of the comparator circuit VCMP in order to supply the control signal EN_VCMP;

an output node s15_fsm connected to the gate of the transistor SWPG1 in order to supply the control signal EN_SWPG1;

an output node s16_fsm connected to the gate of the transistor SWPG2 in order to supply the control signal EN_SWPG2;

an output node s17_fsm connected to the gate of the transistor SWPGVMAX in order to supply the control signal EN_SWPGVMAX;

an input node e1_fsm connected to the output node s_cmp of the voltage comparator VCMP in order to receive the output voltage VCOVVDD from the comparator VCMP;

and an input node e2_fsm connected to the output node s_del of the delay generator circuit DEL in order to receive the output voltage DELAY_OK from the circuit DEL.

In the example shown, the sequencing circuit FSM furthermore comprises a control input 310 on one or more bits (DIGBUS[1:x]) for controlling the voltage selection circuit in the first configuration (transistor PSH and PSL respectively closed and open) or in the second configuration (transistor PSH and PSL respectively open and closed), and, where applicable, for configuring certain parameters of the configuration circuit CONF. The sequencing circuit FSM furthermore comprises a power supply node p1_fsm connected to the node for supplying the internal supply voltage VMAX_INT. In this example, the sequencing circuit FSM furthermore comprises a power supply node p2_fsm connected to the node for supplying the supply voltage VANA. The implementation of the sequencing circuit FSM has not been detailed, since the implementation of such a circuit is within the ability of those skilled in the art based on the functional indications described in this application.

Figure 2B:
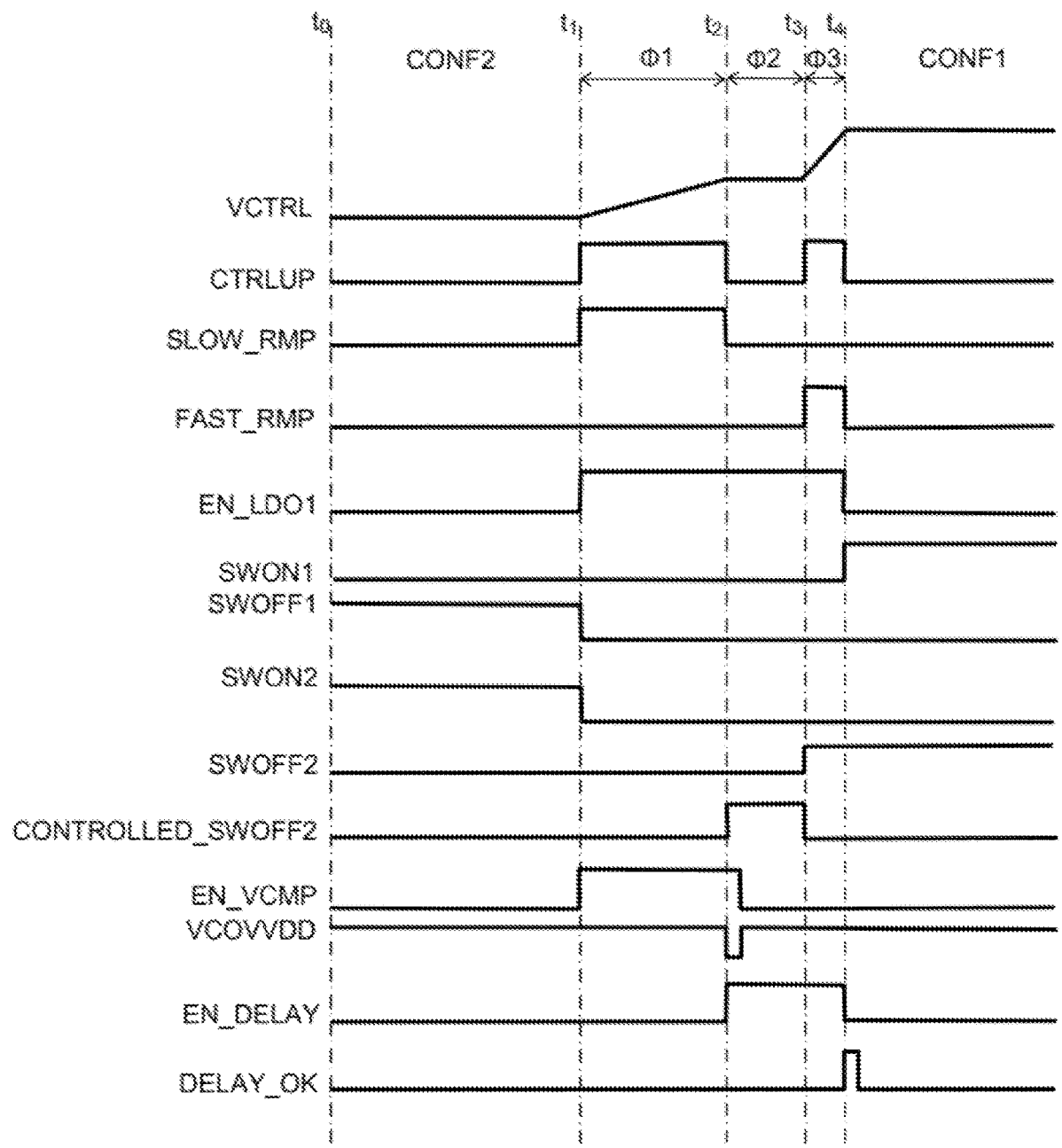
FIG. 2b illustrates a timing diagram showing one example of an operating mode during an upward transition of the circuit according to the first embodiment.
Figure 2C:
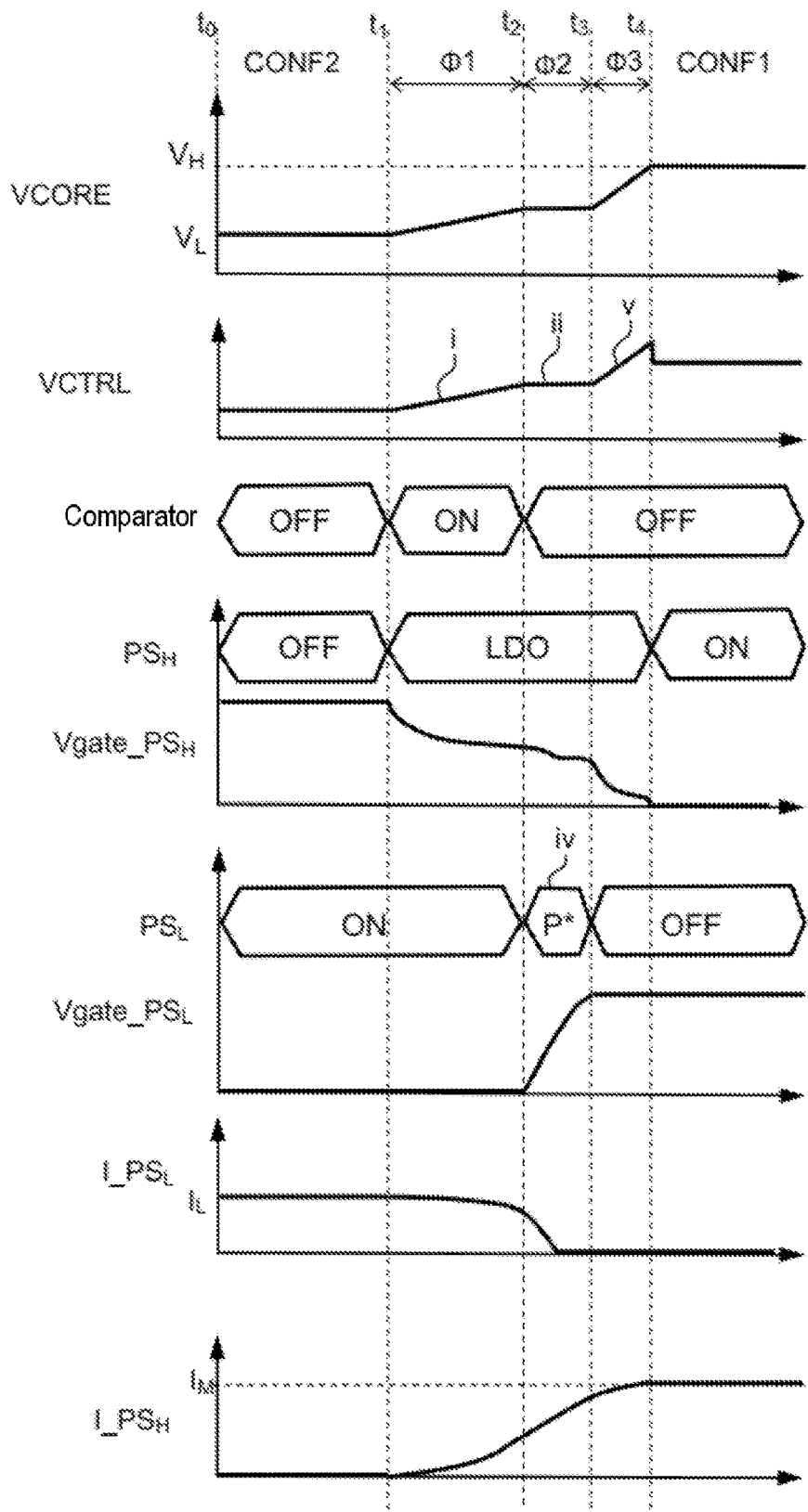
FIG. 2c illustrates a functional diagram showing one example of an operating mode during an upward transition of the circuit according to the first embodiment.

FIG. 2b illustrates a timing diagram showing one example of an operating mode during an upward transition of the circuit according to the first embodiment from FIG. 2a. FIG. 2c illustrates a functional diagram showing the operating mode of the selection circuit VSj from the first embodiment during an upward transition.

The references t0, t1, t2, t3 and t4 are common to FIGS. 2b and 2c. FIG. 2b illustrates the sequence of a few signals for controlling the selection circuit, making it possible to achieve the operation of said circuit as illustrated in FIG. 2c. It will be recalled that this involves an upward transition, and the system therefore moves from the second configuration CONF2 to the first configuration CONF1. For the sake of simplicity, FIG. 2b makes do with showing the following signals, which have variations during the upward transition according to the invention: the analogue voltage ramp signal VCTRL, and the binary control signals, specifically CTRLUP, SLOW_RMP, FAST_RMP, EN_LDO1, SWON1, SWOFF1, SWON2, SWOFF2, CONTROLLED_SWOFF2, EN_VCMP, VCOVVDD, EN_DELAY, and DELAY_OK. Throughout the entire upward transition, the switch i1 is kept closed, the switches K1 and K4 are kept closed and the switches K2 and K3 open, so as to compare VCORE with the second threshold Vthreshold2 equal to VDDH−ΔV, where ΔV>0.

At the time t0, the selection circuit VSj is in a state corresponding to the second configuration CONF2 in which the configuration circuit CONF keeps the first and second transistors PSH and PSL respectively in the off state and in the on state so as to apply the second input supply voltage VDDL to the third node 103. The signals CTRLUP, SLOW_RMP, FAST_RMP, EN_LDO1, CONTROLLED_SWOFF2, EN_VCMP, VCOVVDD, EN_DELAY, and DELAY_OK are in a low state (deactivated), since the system is in a stationary state at this time. The signals SWON1, SWOFF1 are respectively in a low (deactivated) and high (activated) state in order to keep the transistor PSH in the off state. As may be seen in FIG. 2c, the gate voltage of the transistor PSH VGATE_PSH is at a high level, the transistor PSH is in the off state and the current I_PSH through PSH is zero or virtually zero. The signals SWOFF2, SWON2 are respectively in a low (deactivated) and high (activated) state in order to keep the transistor PSL in the on state. As may be seen in FIG. 2c, the gate voltage of the transistor PSL VGATE_PSL is at a low level, the transistor PSL is in the on state and the current I_PSL through PSL is equal to IL>0.

At the time t1, the first phase ϕ1 of the upward transition is triggered. The change of the signals for controlling the ramp generator CTRUP and SLOW_RMP to a high state activates the generation of an increasing voltage ramp having a predetermined slow slope. It is possible to see the trend of the ramp on the signal VCTRL. At the same time, since a transitory state of the whole system is involved, the holding signals SWOFF1, SWON1, SWOFF2 and SWON2 all change to a low state. The signal for activating the comparator circuit EN_CMP also changes to a high state, thus activating the comparator during ϕ1. The activation signal EN_LDO1 activates the first linear regulation circuit LDO1 so as to control the first transistor PSH in linear regime in order to apply the slow voltage ramp VCTRL to the third node 103 during the slow phase ϕ1 as indicated on the evolution of the output supply voltage VCORE in FIG. 2c. This evolution of VCORE with a slow slope (<1 V/µs) makes it possible to minimize the variation in the current I_PSH through PSH over time, thus making it possible to solve the problem of switching noise generated by proportional voltage variations d (I_PSH)/dt across the terminals of the parasitic inductances of the supply rails.

At the time t2, the comparator VCMP detects the change of the output supply voltage beyond the threshold voltage Vthreshold2 equal to VDDH−ΔV, where ΔV>0. The comparator VCMP thus generates a downward pulse via the output signal VCOVVDD. Following this detection, the following phase ϕ2 is triggered with the change of the signal SLOW_RMP and of the signal CTRUP to a low state (deactivated), thus stopping the generation of the ramp with a slow slope on the signal VCTRL and thus the output supply voltage VCORE via the slaving performed by the circuit LDO1, which is still activated. The signal VCTRL (and therefore VCORE) are thus kept at a constant voltage as indicated in FIG. 2c for the predetermined duration between t2 and t3. This predetermined duration then defines a constant intermediate phase ϕ2 in which the transition of the transistor PSH from an off state to an on state is paused. On the other hand, during the constant phase ϕ2, the signal CONTROLLED_SWOFF2 changes to a high state, thus activating the gradual transition circuit TR_GR2. The gradual transition circuit TR_GR2 thus applies, during the intermediate phase ϕ2, a control signal VGATE_PSL having a gradual variation to the gate of the second transistor PSL in order to gradually switch the second transistor PSL to an off state as shown in the diagrams, VGATE_PSL (voltage on the gate PSL) of I_PSL (current through PSL) from FIG. 2c. The switch i4 is closed throughout the entire intermediate phase ϕ2. The gradual and controlled closing of the transistor PSL in terms of voltage and current thus makes it possible to solve the problem of switching noise generated by the proportional voltage variations d (I_PSL)/dt across the terminals of the parasitic inductances of the supply rails. In addition, pausing the closing of the transistor PSH during intermediate phase ϕ2 makes it possible to eliminate the possibility of having a time in the transition when the two transistors PSL and PSH are in the on state at the same time. This thus eliminates any risk of a problem with reverse currents.

Following the detection of the change of the output supply voltage beyond the threshold voltage Vthreshold2, the comparator circuit VCMP is stopped via the signal EN_VCMP in order to limit the overall consumption of the circuit. In addition, the delay generation circuit is activated via the signal EN_DELAY in order to start counting the predefined delay for the rest of the upward transition.

At the time t3, the transistor PSL switches fully to an off state as illustrated in FIG. 2c, where the current I_PSL is zero or virtually zero. The closing of the transistor PSH is thus resumed and the phase ϕ3 is triggered. Thus, at t3, the change of the signals for controlling the ramp generator CTRUP and FAST_RMP to a high state activates the generation of an increasing voltage ramp having a predetermined fast slope. It is possible to see the trend of the ramp on the signal VCTRL. The activation signal EN_LDO1 still keeps the first linear regulation circuit LDO1 active so as to control the first transistor PSH in linear regime in order to apply the fast voltage ramp VCTRL to the third node 103 during the fast phase ϕ3 as indicated on the evolution of the output supply voltage VCORE in FIG. 2c, which reaches the high supply voltage value VDDH. The fast phase ϕ3 makes it possible to finalize the upward transition with a reduced delay so as to still keep a transition speed from one supply voltage to another while at the same time reducing disruption caused by inductive switching noise. Specifically, the starting point of the voltage VCORE at t3 is close to the target supply voltage VDDH, and the inrush current through I_PSH is thus reduced as illustrated in FIG. 2c, hence the reduction in noise even with a slow slope at the end of the transition.

At t4, the previously activated delay generation circuit generates, via the signal DELAY_OK, a pulse indicating that the predetermined duration provided for all of the phases ϕ2 and ϕ3 has elapsed. This corresponds to the end of the upward transition and the change to the first configuration CONF1. The signals CTRLUP, SLOW_RMP, FAST_RMP, EN_LDO1, CONTROLLED_SWOFF2, EN_VCMP, VCOVVDD, EN_DELAY, and DELAY_OK are in a low state (deactivated), since the system is in a stationary state at this time. The signals SWOFF1, SWON1 are respectively in a low (deactivated) and high (activated) state in order to keep the transistor PSH in the on state via the closed switch i1. As may be seen in FIG. 2c, the gate voltage of the transistor PSH VGATE_PSH is at a low level, the transistor PSH is in the on state and the current I_PSH through PSH is equal to IM>0. The signals SWON2, SWOFF2 are respectively in a low (deactivated) and high (activated) state in order to keep the transistor PSL in the off state through the closed switch i3. As may be seen in FIG. 2c, the gate voltage of the transistor PSL VGATE_PSL is at a high level, the transistor PSL is in the off state and the current I_PSL through PSL is zero or virtually zero.

Figure 2D:
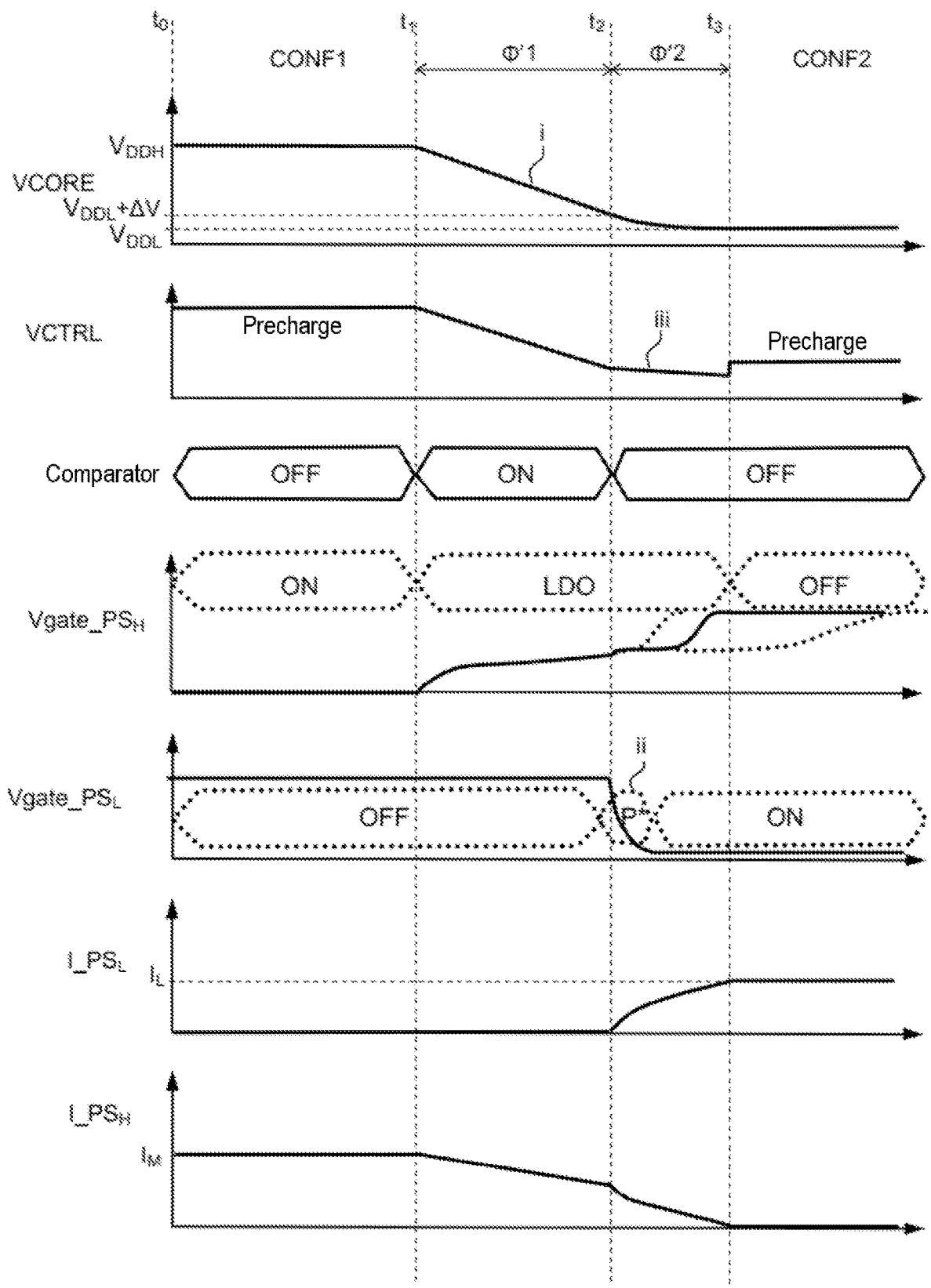
FIG. 2d illustrates a functional diagram showing one example of an operating mode during a downward transition of the circuit according to the first embodiment.

FIG. 2d illustrates a functional diagram showing the operating mode of the selection circuit VSj from the first embodiment during a downward transition of the voltage VCORE from the high supply voltage VDDH to the low supply voltage VDDL. Throughout the entire downward transition, the switch i1 is kept closed, the switches K3 and K2 are kept closed and the switches K1 and K4 open, so as to compare VCORE with the second threshold Vthreshold2 equal to VDDL+ΔV, where ΔV>0.

At the time t0, the selection circuit VSj is in a state corresponding to the first configuration CONF1 in which the configuration circuit CONF keeps the first and second transistors PSH and PSL respectively in the on state and in the off state so as to apply the high input supply voltage VDDH to the third node 103. The signals CTRLDW, SLOW_RMP, FAST_RMP, EN_LDO1, CONTROLLED_SWOFF2, EN_VCMP, VCOVVDD, EN_DELAY, and DELAY_OK are in a low state (deactivated), since the system is in a stationary state at this time. The signals SWOFF1, SWON1 are respectively in a low (deactivated) and high (activated) state in order to keep the transistor PSH in the on state via the closed switch i1. As may be seen in FIG. 2d, the gate voltage of the transistor PSH VGATE_PSH is at a low level, the transistor PSH is in the on state and the current I_PSH through PSH is equal to IM>0. The signals SWON2, SWOFF2 are respectively in a low (deactivated) and high (activated) state in order to keep the transistor PSL in the off state via the closed switch i3. As may be seen in FIG. 2d, the gate voltage of the transistor PSL VGATE_PSL is at a high level, the transistor PSL is in the off state and the current I_PSL through PSL is zero or virtually zero.

At the time t1, the first phase ϕ'1 of the downward transition is triggered. The change of the signals for controlling the ramp generator CTRDW and FAST_RMP to a high state activates the generation of a decreasing voltage ramp having a predetermined fast slope. It is possible to see the trend of the ramp on the signal VCTRL. At the same time, since a transitory state of the whole system is involved, the holding signals SWOFF1, SWON1, SWOFF2 and SWON2 all change to a low state. The signal for activating the comparator circuit EN_CMP also changes to a high state, thus activating the comparator during ϕ'1. The activation signal EN_LDO1 activates the first linear regulation circuit LDO1 so as to control the first transistor PSH in linear regime in order to apply the fast voltage ramp VCTRL to the third node 103 during the first phase ϕ'1 as indicated on the evolution of the output supply voltage VCORE in FIG. 2d.

At the time t2, the comparator VCMP detects the change of the output supply voltage to a value less than the threshold voltage Vthreshold1 equal to VDDL+ΔV, where ΔV>0. The comparator VCMP thus generates a pulse via the output signal VCOVVDD. Following this detection, the following phase ϕ'2 is triggered with the change of the signal FAST_RMP to a low state (deactivated) and the change of the signal SLOW_RMP to a high state, thus making it possible to generate the ramp with a slow slope on the signal VCTRL and thus the output supply voltage VCORE via the slaving performed by the circuit LDO1, which is still activated. The signal VCTRL (and therefore VCORE) thus follow a slow decreasing ramp as indicated in FIG. 2d for the predetermined duration between t2 and t3. On the other hand, during the slow phase ϕ'2, the signal CONTROLLED_SWON2 changes to a high state, thus activating the gradual transition circuit TR_GR2. The gradual transition circuit TR_GR2 thus applies, during the intermediate phase ϕ'2, a control signal VGATE_PSL having a gradual decreasing variation to the gate of the second transistor PSL in order to gradually switch the second transistor PSL to an on state as shown in the diagrams, VGATE_PSL (voltage on the gate PSL) of I_PSL (current through PSL) from FIG. 2d. The switch i4 is closed throughout the entire slow phase ϕ'2. The gradual and controlled closing of the transistor PSL in terms of voltage and current thus makes it possible to solve the problem of switching noise generated by the proportional voltage variations d (I_PSL)/dt across the terminals of the parasitic inductances of the supply rails. In addition, the delayed triggering of the closing of the transistor PSL during the intermediate phase ϕ'2 makes it possible to eliminate the possibility of having a time in the transition when the two transistors PSL and PSH are fully in the on state at the same time. This thus eliminates any risk of a problem with reverse currents.

Following the detection of the change of the output supply voltage beyond the threshold voltage Vthreshold1, the comparator circuit VCMP is stopped via the signal EN_VCMP in order to limit the overall consumption of the circuit. In addition, the delay generation circuit is activated via the signal EN_DELAY in order to start counting the predefined delay for the slow phase ϕ'2.

At t3, the previously activated delay generation circuit generates, via the signal DELAY_OK, a pulse indicating that the predetermined duration provided for the phase ϕ'2 has elapsed. This corresponds to the end of the downward transition and the change to the second configuration CONF2. The signals CTRLUP, SLOW_RMP, FAST_RMP, EN_LDO1, CONTROLLED_SWOFF2, EN_VCMP, VCOVVDD, EN_DELAY, and DELAY_OK are in a low state (deactivated), since the system is in a stationary state at this time. The signals SWON1, SWOFF1 are respectively in a low (deactivated) and high (activated) state in order to keep the transistor PSH in the off state via the closed switch i1. As may be seen in FIG. 2c, the gate voltage of the transistor PSH VGATE_PSH is at a high level, the transistor PSH is in the off state and the current I_PSH through PSH is zero or virtually zero. The signals SWON2, SWOFF2 are respectively in a high (activated) and low (deactivated) state in order to keep the transistor PS L in the on state with the switch i3 closed. As may be seen in FIG. 2d, the gate voltage of the transistor PSL VGATE_PSL is at a low level, the transistor PSL is in the on state and the current I_PSL through PSL is equal to IL>0.

The above-described sequencing of the steps implemented by the circuit for selecting the supply voltage VSj according to a first embodiment of the invention thus makes it possible to achieve dynamic voltage scaling while at the same time limiting supply inductive switching noise and while avoiding the phenomenon of reverse currents for upward and downward transitions. Without loss of generality and by way of illustration, in the following section, a description will be given of a second embodiment of the invention and the associated configuration for solving the problem of inductive switching noise.

Figure 3A:
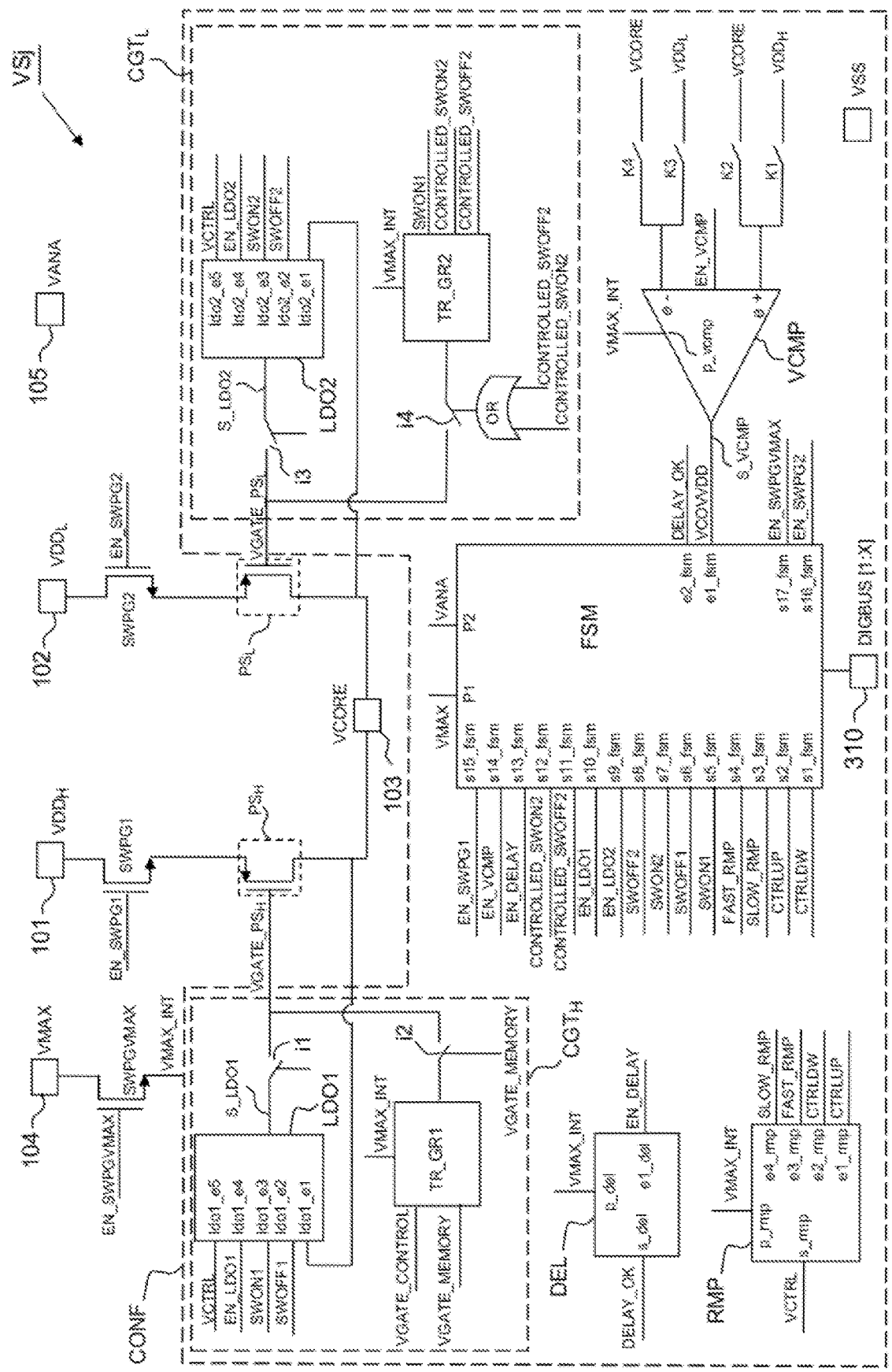
FIG. 3a illustrates an electronic circuit for selecting a supply voltage according to a second embodiment of the invention.

FIG. 3a illustrates an electronic circuit for selecting a supply voltage according to a second embodiment of the invention.

The selection circuit VSj according to the second embodiment adopts the same elements described above for the first embodiment with one difference, as follows. The first transition management circuit CGTH furthermore comprises a gradual transition circuit TR_GR1 having an output node gr1_s connected to the gate of the first transistor PSH via a switch i2. The first gradual transition circuit TR_GR1 is able to apply a control signal VGATE_PSH having a gradual variation to the gate of the second transistor PSL when the second switch i2 is in the on state. The switch i2 is closed when the signal VGATE_MEMORY is activated. The gradual transition circuit TR_GR1 receives two activation signals VGATE_MEMORY and VGATE_CONTROL. By way of example, a gradual voltage variation is a variation over time that may be modeled using a logarithmic law ln(x), a linear law with a slow slope (<1 V/µs absolute value) or an exponential law exp(-x), where x>0. The gradual transition is achieved for example by charging and discharging a capacitive element having a terminal connected to the gate VGATE_PSH.

Figure 3B:
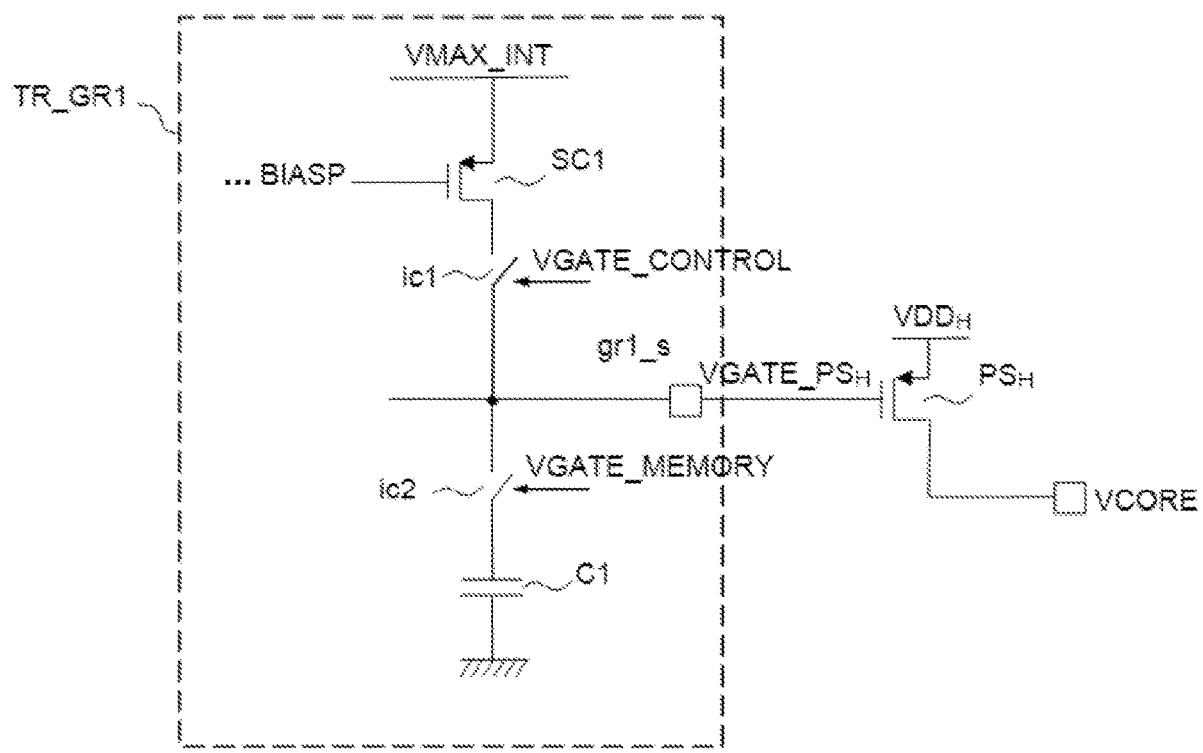
FIG. 3b illustrates one exemplary embodiment of a first gradual transition circuit used in the circuit for selecting a supply voltage according to the second embodiment of the invention.
Figure 3C:
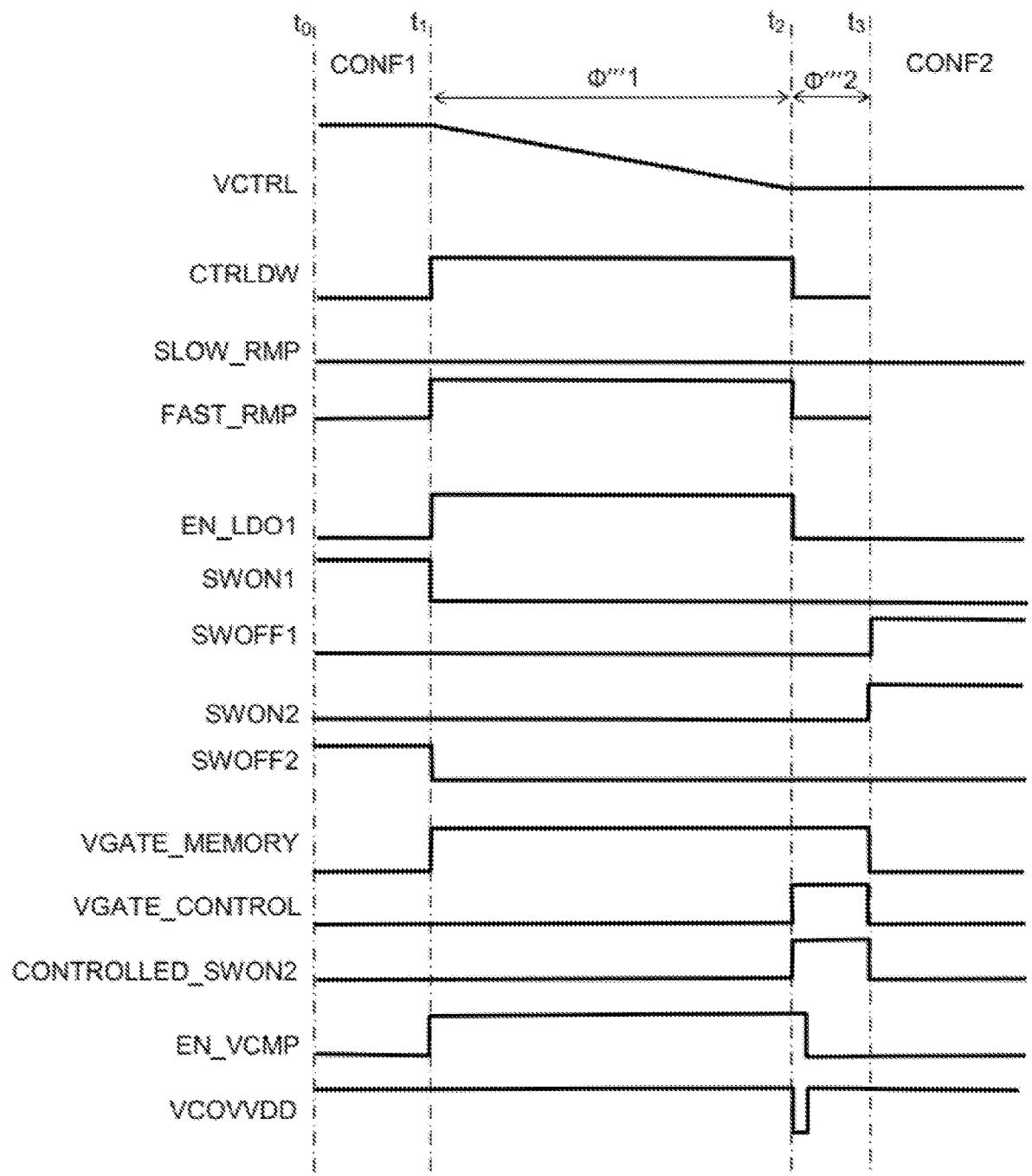
FIG. 3c illustrates a timing diagram showing one example of an operating mode during a downward transition of the circuit according to the second embodiment.
Figure 3D:
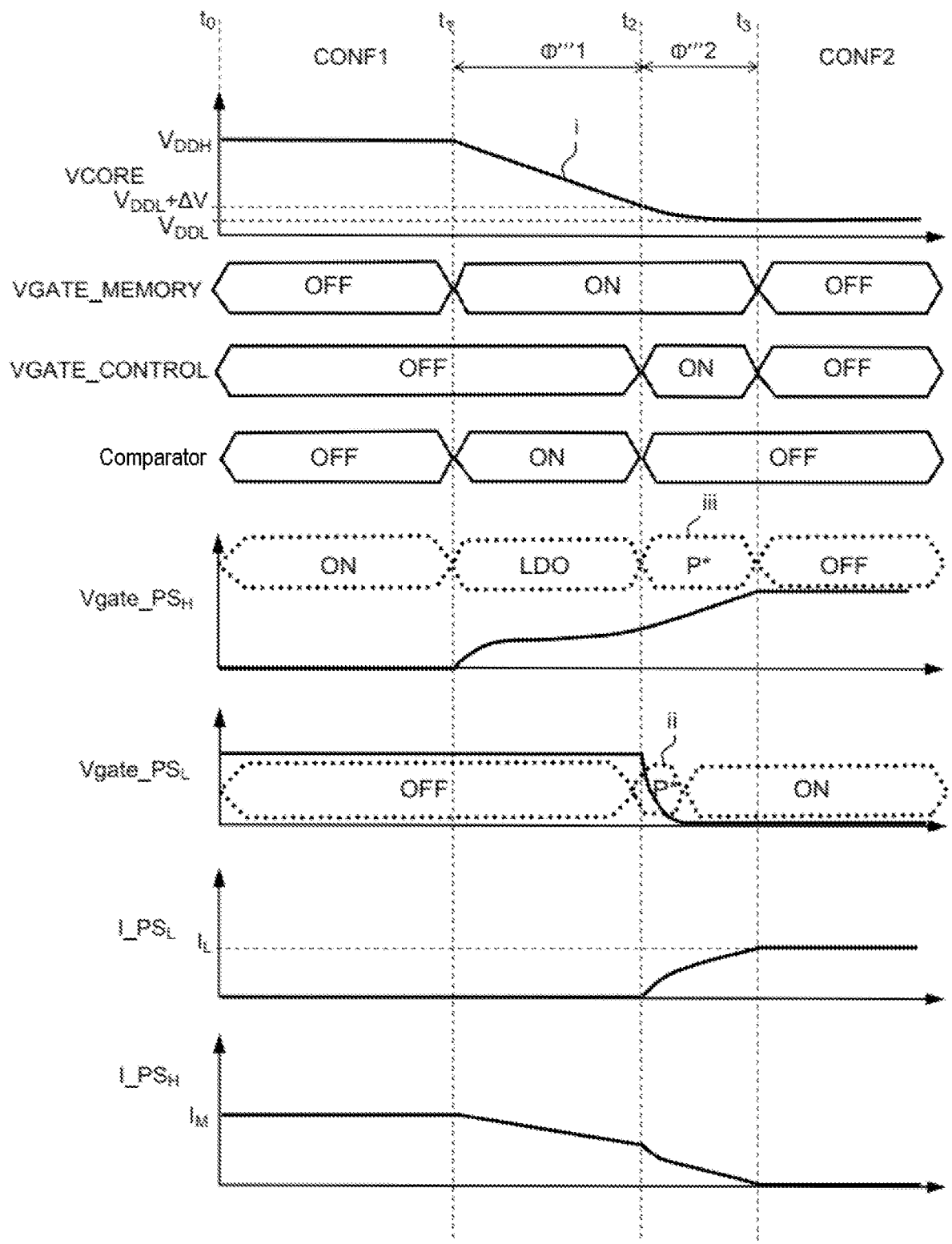
FIG. 3d illustrates a functional diagram showing one example of an operating mode during a downward transition of the circuit according to the second embodiment.

FIG. 3b illustrates one exemplary implementation of the gradual transition circuit TR_GR1 according to the invention. The gradual transition circuit TR_GR1 comprises a PMOS transistor SC1 controlled by a bias signal BIASP, a switch ic1 controlled by the signal VGATE_CONTROL, a switch ic2 controlled by the signal VGATE_MEMORY, and a capacitive element C1. The source of the transistor SC1 is connected to the internal supply voltage, the drain is connected, when the switch ic1 is in the on state, to the output node gr1_s corresponding to the control signal VGATE_PSH, and the gate is biased so as to form a current source. The switch ic1 is in the on state when VGATE_CONTROL is activated and in the off state when it is not. The switch ic2 is in the on state when VGATE_MEMORY is activated and in the off state when it is not. The capacitive element C1 is connected on the one hand to electrical ground and on the other hand to the output node gr1_s corresponding to the control signal VGATE_PSH when the switch i2 is in the on state. When VGATE_MEMORY is activated and VGATE_CONTROL is deactivated, the capacitive element acts as a local memory point for the signal VGATE_PSH collected on the output node gr1_s. When the two signals VGATE_MEMORY and VGATE_CONTROL are simultaneously activated, the capacitive element C1 charges via the current source SC1 so as to apply a control signal VGATE_PSH having a gradual variation to the gate of the first transistor PSH. It will be recalled that the charge curve of a capacitor of capacitance C over time t with a constant current I takes the form V(t)=It/C. It will be recalled that the charge curve of a capacitor in series with a resistor over time with a constant current takes the form $V(t)=V_{cmax}(1-e^{-t/\tau})$, where $V_{cmax}$ and $\tau$ are positive constants. FIG. 3c illustrates a timing diagram showing one example of an operating mode during a downward transition of the circuit according to the second embodiment from FIG. 3a. FIG. 3d illustrates a functional diagram showing the operating mode of the selection circuit VSj from the second embodiment during a downward transition.

The references t0, t1, t2 and t3 are common to FIGS. 3c and 3d. FIG. 3c illustrates the sequence of a few signals for controlling the selection circuit, making it possible to achieve the operation of said circuit as illustrated in FIG. 3d. It will be recalled that this involves a downward transition, and the system therefore moves from the first configuration CONF1 to the second configuration CONF2. For the sake of simplicity, FIG. 3c makes do with showing the following signals, which have variations during the downward transition according to the invention: the analogue voltage ramp signal VCTRL, and the binary control signals, specifically CTRLDW, SLOW_RMP, FAST_RMP, EN_LDO1, SWON1, SWOFF1, SWON2, SWOFF2, VGATE_MEMORY, VGATE_CONTROL, CONTROLLED_SWON2, EN_VCMP, VCOVVDD. Throughout the entire downward transition, the switch i1 is kept closed, the switches K3 and K2 are kept closed and the switches K1 and K4 open, so as to compare VCORE with the second threshold Vthreshold2 equal to VDDL+ΔV, where ΔV>0.

At the time t0, the selection circuit VSj is in a state corresponding to the first configuration CONF1 in which the configuration circuit CONF keeps the first and second transistors PSH and PSL respectively in the on state and in the off state so as to apply the high input supply voltage VDDH to the third node 103. The signals CTRLDW, SLOW_RMP, FAST_RMP, EN_LDO1, CONTROLLED_SWOFF2, EN_VCMP, VCOVVDD, VGATE_MEMORY and VGATE_CONTROL are in a low state (deactivated), since the system is in a stationary state at this time. The signals SWOFF1, SWON1 are respectively in a low (deactivated) and high (activated) state in order to keep the transistor PSH in the on state via the closed switch i1. As may be seen in FIG. 2d, the gate voltage of the transistor PSH VGATE_PSH is at a low level, the transistor PSH is in the on state and the current I_PSH through PSH is equal to IM>0. The signals SWON2, SWOFF2 are respectively in a low (deactivated) and high (activated) state in order to keep the transistor PSL in the off state via the closed switch i3. As may be seen in FIG. 2d, the gate voltage of the transistor PSL VGATE_PSL is at a high level, the transistor PSL is in the off state and the current I_PSL through PSL is zero or virtually zero.

At the time t1, the first phase φ'''1 of the downward transition is triggered. The change of the signals for controlling the ramp generator CTRDW and FAST_RMP to a high state activates the generation of a decreasing voltage ramp having a predetermined fast slope. It is possible to see the trend of the ramp on the signal VCTRL. At the same time, since a transitory state of the whole system is involved, the holding signals SWOFF1, SWON1, SWOFF2 and SWON2 all change to a low state. The signal for activating the comparator circuit EN_CMP also changes to a high state, thus activating the comparator during φ'''1. The activation signal EN_LDO1 activates the first linear regulation circuit LDO1 so as to control the first transistor PSH in linear regime in order to apply the fast voltage ramp VCTRL to the third node 103 during the fast phase φ'''1 as indicated on the evolution of the output supply voltage VCORE in FIG. 3c. At the same time, the signal VGATE_MEMORY is activated in order to store an image of the evolution of the signal VGATE_PSH in the memory point to be performed by the capacitor C1 of the gradual transition circuit TR_GR1.

At the time t2, the comparator VCMP detects the change of the output supply voltage to a value less than the threshold voltage Vthreshold1 equal to VDDL+ΔV, where ΔV>0. The comparator VCMP thus generates a pulse via the output signal VCOVVDD. Following this detection, the following phase ϕ'''2 is triggered with the change of the signals EN_LDO1 and FAST_RMP to a low state (deactivated) and the change of the signal VGATE_CONTROLLED to a high state. As explained above, the simultaneous activation of VGATE_CONTROLLED and VGATE_MEMORY thus makes it possible to apply a control signal VGATE_PSH having a gradual increasing variation to the gate of the first transistor PSH. On the other hand, during the slow phase ϕ'''2, the signal CONTROLLED_SWON2 changes to a high state, thus activating the gradual transition circuit TR_GR2. The gradual transition circuit TR_GR2 thus applies, during the intermediate phase ϕ'''2, a control signal VGATE_PSL having a gradual decreasing variation to the gate of the second transistor PSL in order to gradually switch the second transistor PSL to an on state as shown in the diagrams, VGATE_PSL (voltage on the gate PSL) of I_PSL (current through PSL) from FIG. 3d. The switch i4 is closed throughout the entire slow phase ϕ'''2. The gradual and controlled closing of the transistors PSL and PSH in terms of voltage and current thus makes it possible to solve the problem of switching noise generated by the proportional voltage variations d (I_PSL)/dt and d (I_PSH)/dt across the terminals of the parasitic inductances of the supply rails. In addition, the delayed triggering of the closing of the transistor PSL during the intermediate phase ϕ'''2 makes it possible to eliminate the possibility of having a time in the transition when the two transistors PSL and PSH are fully in the on state at the same time. This thus eliminates any risk of a problem with reverse currents.

Following the detection of the change of the output supply voltage beyond the threshold voltage Vthreshold1, the comparator circuit VCMP is stopped via the signal EN_VCMP in order to limit the overall consumption of the circuit. In addition, the delay generation circuit is activated via the signal EN_DELAY in order to start counting the predefined delay for the slow phase ϕ'''2.

At t3, the previously activated delay generation circuit generates, via the signal DELAY_OK (not shown), a pulse indicating that the predetermined duration provided for the phase ϕ'''2 has elapsed. This corresponds to the end of the downward transition and the change to the second configuration CONF2. The signals CTRLDW, SLOW_RMP, FAST_RMP, EN_LDO1, CONTROLLED_SWOFF2, EN_VCMP, VCOVVDD, VGATE_MEMORY and VGATE_CONTROL are in a low state (deactivated), since the system is in a stationary state at this time. The signals SWON1, SWOFF1 are respectively in a low (deactivated) and high (activated) state in order to keep the transistor PSH in the off state via the closed switch i1. As may be seen in FIG. 3d, the gate voltage of the transistor PSH VGATE_PSH is at a high level, the transistor PSH is in the off state and the current I_PSH through PSH is zero or virtually zero. The signals SWON2, SWOFF2 are respectively in a high (activated) and low (deactivated) state in order to keep the transistor PSL in the on state with the switch i3 closed. As may be seen in FIG. 3d, the gate voltage of the transistor PSL VGATE_PSL is at a low level, the transistor PSL is in the on state and the current I_PSL through PSL is equal to IL>0.

Figure 3E:
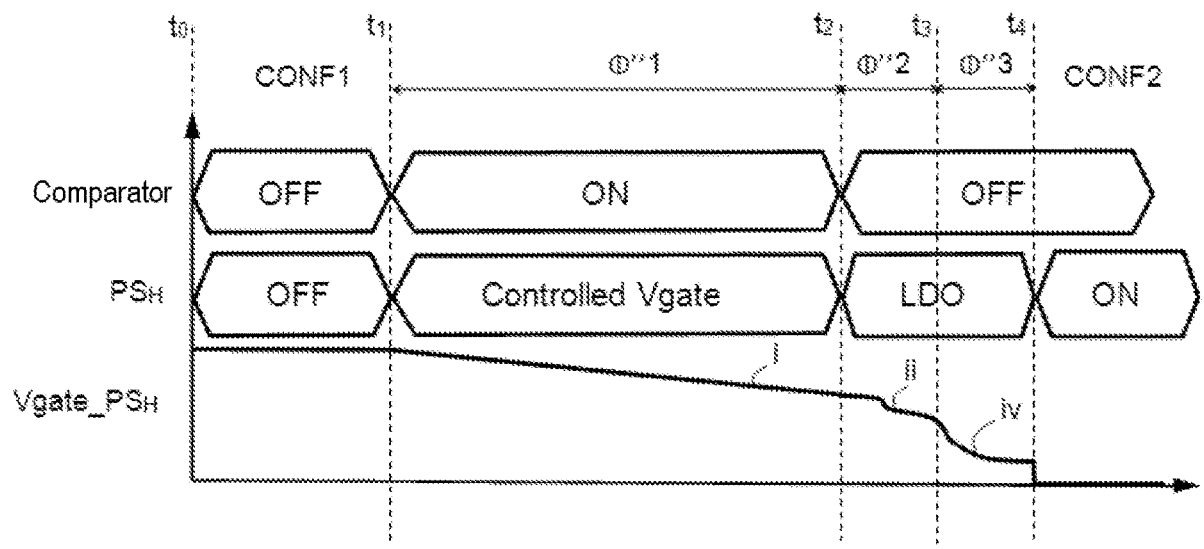
FIG. 3e illustrates a functional diagram showing one example of an operating mode during an upward transition of the circuit according to the second embodiment.

FIG. 3e illustrates a timing diagram showing one example of an operating mode during an upward transition of the circuit according to the second embodiment from FIG. 3a. For the sake of simplicity, only the operation of the first transistor PSH is shown, which changes in comparison with the upward transition from the first embodiment.

During the slow phase ϕ''1 (equivalent to the slow phase ϕ1 from the first embodiment) of the upward transition, the signal VGATE_PSH is not controlled via the activation of the first linear regulation circuit LDO1 that receives a ramp, but by directly applying a control signal VGATE_PSH having a gradual decreasing variation to the gate of the first transistor PSH using the gradual transition circuit TR_GR1.

Figure 4A:
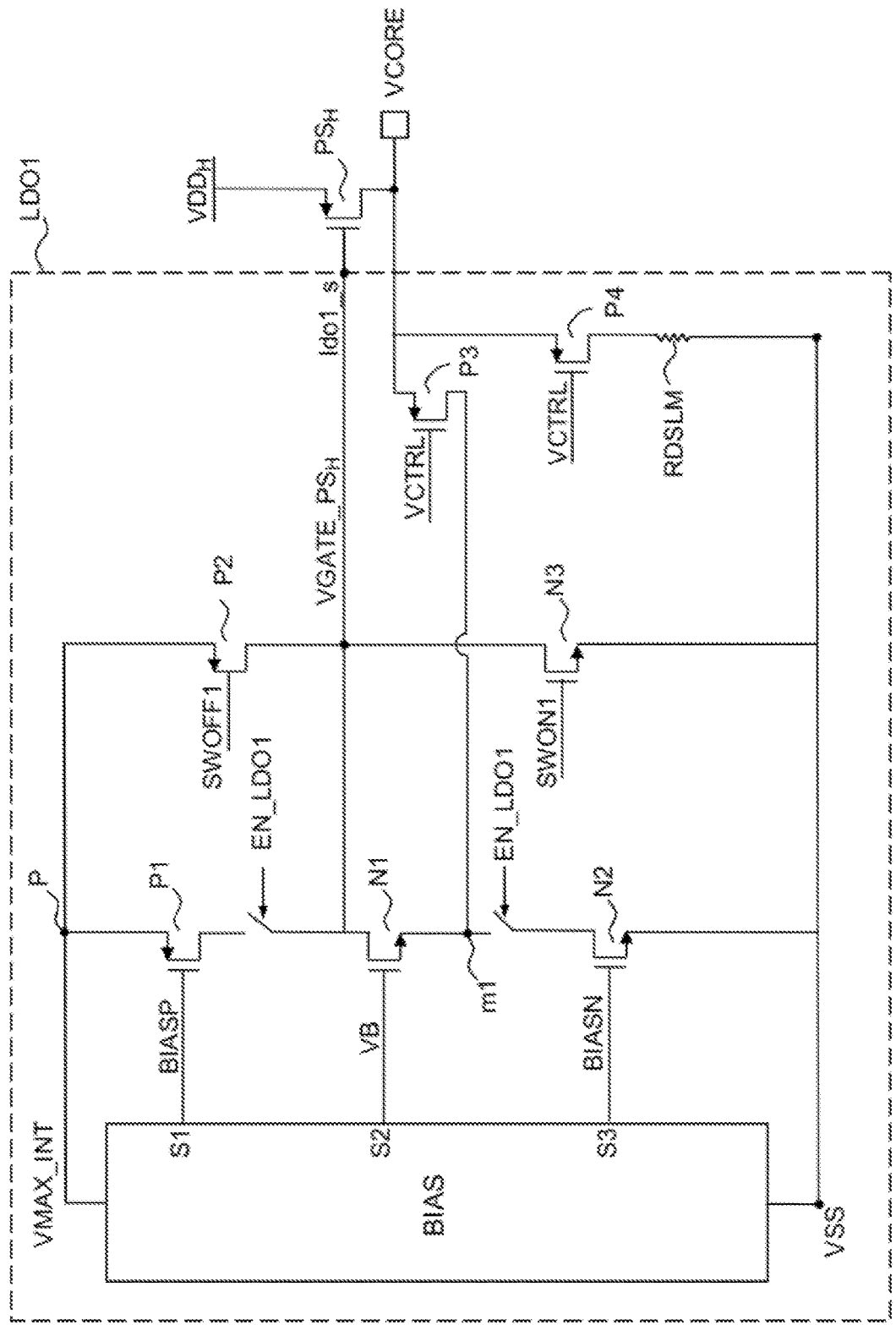
FIG. 4a illustrates one exemplary embodiment of a linear voltage regulation circuit of the circuit for selecting a supply voltage according to the invention.

By way of example, FIG. 4a illustrates one exemplary embodiment of the first linear voltage regulation circuit LDO1 implemented in a circuit for selecting a supply voltage according to the invention.

The linear voltage regulation circuit LDO1 from FIG. 4a comprises a bias circuit BIAS powered by the voltage VMAX_INT. The bias circuit BIAS comprises a node s1 for supplying a bias voltage BIASP, a node s2 for supplying a bias voltage VB, and a node s3 for supplying a bias voltage BIASN.

The circuit LDO1 furthermore comprises a PMOS transistor P1 connecting, via its conduction nodes, the power supply node supplying the voltage VMAX_INT to the output node of LDO1 denoted Ido1_s, and therefore the gate of the transistor PSH. The gate of the transistor P1 is connected to the output node s1 of the circuit BIAS in order to receive the bias signal BIASP. The circuit LDO1 furthermore comprises an NMOS transistor N1 connecting, via its conduction nodes, the output node Ido1_s of the circuit LDO1 to an intermediate node n1, and an N-type transistor N2 connecting, via its conduction nodes, the node n1 to ground VSS. The gate of the transistor N1 is connected to the output node s2 of the circuit BIAS in order to receive the bias signal VB, and the gate of the transistor N2 is connected to the output node s3 of the circuit BIAS in order to receive the bias signal BIASN.

The circuit LDO1 from FIG. 4a additionally comprises a PMOS transistor P3 connecting, via its conduction nodes, the node for supplying the voltage VCORE to the internal node n1. The gate of the transistor P3 is connected to the node for supplying the ramp voltage VCTRL. In this example, the circuit LDO1 furthermore comprises a PMOS transistor P4 connected in series, via its conduction nodes, with a resistor RDISLIM, between the node for supplying the ramp voltage VCTRL and electrical ground VSS. The gate of the transistor P4 is connected to the node for applying the setpoint voltage VCTRL. The circuit LDO1 from FIG. 4a furthermore comprises a PMOS transistor P2 connecting, via its conduction nodes, the power supply node p of the circuit LDO1 to its output node Ido1_s, and an NMOS transistor N3 connecting, via its conduction nodes, the output node Ido1_s to electrical ground VSS. The gate of the transistor N3 is connected to the node for applying the control signal SWON1, and the gate of the transistor P2 is by the logic inverse of the control signal SWOFF1. The logic inverse is obtained by way of an inverter, not shown in order not to overburden the presentation.

Figure 4B:
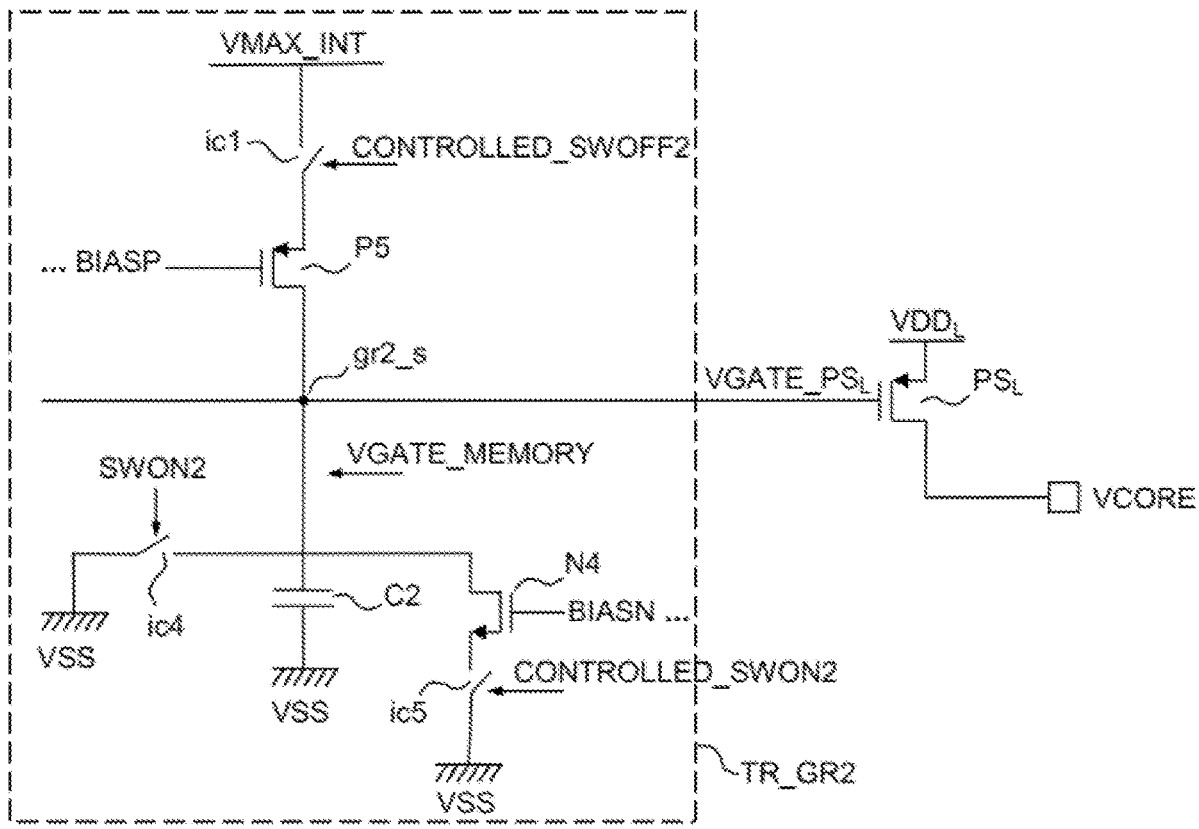
FIG. 4b illustrates one exemplary embodiment of a second gradual transition circuit of the circuit for selecting a supply voltage according to the invention.

By way of example, FIG. 4b illustrates one exemplary embodiment of the gradual transition circuit TR_GR2 of the circuit for selecting a supply voltage according to the invention.

This is an illustrative and non-limiting embodiment based on charging and discharging a capacitive element C2 having a pole connected to the gate of the second transistor PSL that receives the signal VGATE_PSL.

As an alternative, it is possible to use resistors to generate control signals with a gradual variation.

In this capacitive element-based exemplary embodiment, the gradual transition circuit TR_GR2 comprises a PMOS transistor P5 controlled by a bias signal BIASP, a PMOS transistor N4 controlled by a bias signal BIASN, a switch ic3 controlled by the logic inverse of the signal CONTROLLED_SWOFF2, a switch ic4 controlled by the signal SWON2, a switch ic5 controlled by the signal CONTROLLED_SWON2 and a capacitive element C2. To simplify the circuit, it should be noted that the bias signals BIASP and BIASN are generated by a bias circuit BIAS shared with other blocks and not shown for the sake of simplicity.

The source of the transistor P5 is connected to the internal supply voltage VMAX_INT when the switch ic3 is in the on state and its drain is connected to the output node corresponding to the gate of PSL. The gate of P5 is biased so as to form a current source. The source of the transistor N4 is connected to ground VSS when the switch ic5 is in the on state and its drain is connected to the output node connected to the gate of PSL. The gate of N4 is biased so as to form a current source. The switch ic3 is in the on state when CONTROLLED_SWOFF2 is activated and in the off state when it is not. The switch ic4 is in the on state when SWON2 is activated and in the off state when it is not. The capacitive element C2 is connected on the one hand to electrical ground and on the other hand to the output node gr2_s corresponding to the control signal VGATE_$PS_L$ when the switch i4 is in the on state.

Thus, in order to apply a signal having a gradual increasing variation of the signal VGATE_$PS_L$, the signal CONTROLLED_SWOFF2 is activated and the other signals SWON2, CONTROLEED_SWON2 are deactivated so as to gradually charge the capacitive element C2, thus achieving the desired gradual variation on VGATE_$PS_L$.

In order to apply a signal having a gradual increasing variation VGATE_$PS_L$, the signal CONTROLLED_SWOFF2 is deactivated and the signal CONTROLEED_SWON2 is activated so as to gradually discharge the capacitive element C2 through the branch of N4, thus achieving the desired gradual variation on VGATE_$PS_L$.

Following the end of a transition, in order to keep the signal VGATE_$PS_L$ at a low level (connected to ground), it is enough to activate the signal SWON2 in order to close the switch ic4, thus connecting VGATE_$PS_L$ to ground.

The invention claimed is:

1. A circuit for selecting a supply voltage ($VS_j$), comprising:
   a first node designed to receive a first input supply voltage ($VDD_H$);
   a second node designed to receive a second input supply voltage ($VDD_L$) less than the first input supply voltage ($VDD_H$);
   a third node designed to supply an output supply voltage (VCORE);
   a first power transistor ($PS_H$) connecting the first node to the third node;
   a second power transistor ($PS_L$) connecting the second node to the third node;
   and a configuration circuit (CONF) designed, in a first configuration, to keep the first ($PS_H$) and second ($PS_L$) transistors respectively in the on state and in the off state so as to apply the first input supply voltage ($VDD_H$) to the third node and, in a second configuration, to keep the first ($PS_H$) and second ($PS_L$) transistors respectively in the off state and in the on state so as to apply the second input supply voltage ($VDD_L$) to the third node;
   a transition phase from the first configuration to the second configuration being called downward transition;
   a transition phase from the second configuration to the first configuration being called upward transition;
   the configuration circuit (CONF) comprising:
   a first transition management circuit (CGTH) configured so as to control the gate of the first transistor ($PS_H$) during the upward or downward transition so as to apply, to the third node:
   at least one first voltage ramp having a first slope for a first duration defining a slow phase ($\phi1$, $\phi'2$, $\phi''1$, $\phi'''2$);
   and a second voltage ramp having a second slope, greater than the first slope, for a second duration defining a fast phase ($\phi3$, $\phi'1$, $\phi''3$, $\phi'''1$),
   a second transition management circuit ($CGT_L$) configured so as to control the gate of the second transistor ($PS_L$) during the upward or downward transition so as to apply a control signal (VGATE_$PS_L$) having a gradual variation;
   said first voltage ramp and second voltage ramp being both applied sequentially during the same transition phase such that:
   during an upward transition, the first voltage ramp is applied before the second voltage ramp; and
   during a downward transition, the second voltage ramp is applied before the first voltage ramp.

2. The circuit for selecting a supply voltage ($VS_j$) according to claim 1, wherein the absolute value of the first slope is between one tenth of the absolute value of the second slope and one fifth of the absolute value of the second slope.

3. The circuit for selecting a supply voltage ($VS_j$) according to claim 1, wherein the configuration circuit (CONF), to perform an upward transition, is configured so as to successively execute the following steps:
   vi controlling the first transistor ($PS_H$) in linear regime so as to apply the first voltage ramp to the third node during the slow phase ($\phi1$);
   vii detecting the change of the output supply voltage (VCORE) to a level greater than a predetermined threshold less than the first input supply voltage ($VDD_H$), said change indicating the end of the slow phase;
   viii controlling the first transistor ($PS_H$) in linear regime so as to apply a constant voltage to the third node during an intermediate phase ($\phi2$) between the slow phase and the fast phase;
   ix and applying, during the intermediate phase ($\phi2$), a control signal (VGATE_$PS_L$) having a gradual variation to the gate of the second transistor ($PS_L$) so as to gradually switch the second transistor ($PS_L$) to an off state;
   x controlling the first transistor ($PS_H$) in linear regime so as to apply the second voltage ramp to the third node during the fast phase ($\phi3$) until the first transistor ($PS_H$) changes to an on state.

4. The circuit for selecting a supply voltage ($VS_j$) according to claim 1, wherein the configuration circuit (CONF), to perform a downward transition, is configured so as to successively execute the following steps:
   v controlling the first transistor ($PS_H$) in linear regime so as to apply the second voltage ramp to the third node during the fast phase ($\phi'1$);
   vi detecting the change of the output supply voltage (VCORE) to a level greater than a level lower than a predetermined threshold greater than the second input supply voltage ($VDD_L$), said change indicating the end of the fast phase (ϕ'1);

vii applying, during the slow phase (ϕ'2), a control signal ($VGATE\_PS_L$) having a gradual variation to the gate of the second transistor ($PS_L$) so as to gradually switch the second transistor ($PS_L$) to an on state;

viii and controlling the first transistor ($PS_H$) in linear regime so as to apply the first voltage ramp to the third node during the slow phase (ϕ'2) until the first transistor ($PS_H$) changes to an off state.

5. The circuit for selecting a supply voltage ($VS_j$) according claim 1, wherein the configuration circuit (CONF), to perform an upward transition, is configured so as to successively execute the following steps:

vi applying a second control signal ($VGATE\_PS_H$) having a gradual variation to the gate of the first transistor ($PS_H$) during the slow phase (ϕ"1);

vii detecting the change of the output supply voltage (VCORE) to a level greater than a predetermined threshold less than the first input supply voltage ($VDD_H$), said change indicating the end of the slow phase;

viii controlling the first transistor ($PS_H$) in linear regime so as to apply a constant voltage to the third node during an intermediate phase (ϕ"2) between the slow phase and the fast phase;

ix and applying, during the intermediate phase (ϕ"2), a control signal ($VGATE\_PS_L$) having a gradual variation to the gate of the second transistor ($PS_L$) so as to gradually switch the second transistor ($PS_L$) to an off state;

x controlling the first transistor ($PS_H$) in linear regime so as to apply the second voltage ramp to the third node during the fast phase (ϕ"3) until the first transistor ($PS_H$) changes to an on state.

6. The circuit for selecting a supply voltage ($VS_j$) according to claim 1, wherein the configuration circuit (CONF), to perform a downward transition, is configured so as to successively execute the following steps:

v controlling the first transistor ($PS_H$) in linear regime so as to apply the second voltage ramp to the third node during the fast phase (ϕ'''1);

vi detecting the change of the output supply voltage (VCORE) to a level greater than a level lower than a predetermined threshold greater than the second input supply voltage ($VDD_L$), said change indicating the end of the fast phase (ϕ'''1);

vii applying, during the slow phase (ϕ'''2), a first control signal ($VGATE\_PS_L$) having a gradual variation to the gate of the second transistor ($PS_L$) so as to gradually switch the second transistor ($PS_L$) to an on state;

viii and applying a second control signal ($VGATE\_PS_H$) having a gradual variation to the gate of the first transistor ($PS_H$) so as to apply the first voltage ramp to the third node during the slow phase (ϕ'''2); so as to gradually switch the first transistor ($PS_H$) to an off state.

7. The circuit for selecting a supply voltage ($VS_j$) according to claim 3, wherein the control circuit (CONF) comprises:

a voltage ramp generator (RMP) for generating:
the first upward or downward voltage ramp (VCTRL);
and/or the second upward or downward voltage ramp (VCTRL) on an output node (s_rmp);
and wherein the first transition management circuit ($CGT_H$) comprises a first linear regulation circuit (LDO1) for controlling the first transistor ($PS_H$) in linear regime, and having:
a first input node (ldo1_e1) connected to the third node;
a second input node (ldo1_e2) connected to the output node (s_rmp) of the ramp generator (RMP);
and an output node (ldo1_s) connected to the gate of the first transistor ($PS_H$) via a first switch (i1).

8. The circuit for selecting a supply voltage ($VS_j$) according to claim 7, wherein the first linear regulation circuit (LDO1) is configured so as to control the first transistor ($PS_H$) in linear regime by slaving the output supply voltage (VCORE) to the voltage ramp (VCTRL) applied to the second input node (ldo1_e2) when the first switch (i1) is in the on state.

9. The circuit for selecting a supply voltage ($VS_j$) according to claim 7, wherein the first transition management circuit ($CGT_H$) furthermore comprises a first gradual transition circuit (TR_GR1) having an output node (gr1_s) connected to the gate of the first transistor ($PS_H$) via a second switch (i2), the first gradual transition circuit (TR_GR1) being able to apply a control signal ($VGATE\_PS_H$) having a gradual variation to the gate of the second transistor ($PS_L$) when the second switch (i2) is in the on state.

10. The circuit for selecting a supply voltage ($VS_j$) according to claim 3, wherein the configuration circuit (CONF) furthermore comprises a second transition management circuit ($CGT_L$) comprising:

a second linear regulation circuit (LDO2) having:
a first input node (ldo2_e1) connected to the third node;
a second input node (ldo2_e2) connected to the output node (s_rmp) of the ramp generator (RMP);
and an output node (ldo2_s) connected to the gate of the second transistor ($PS_L$) via a third switch (i3).

11. The circuit for selecting a supply voltage ($VS_j$) according to claim 10, wherein the second transition management circuit ($CGT_L$) comprises a second gradual transition circuit (TR_GR2) having an output node (gr2_s) connected to the gate of the second transistor ($PS_L$) via a fourth switch (i4), said gradual transition circuit (TR_GR) being able to apply a control signal ($VGATE\_PS_L$) to the gate of the second transistor ($PS_L$) when the third switch (i3) is in the on state; said control signal ($VGATE\_PS_L$) having an increasing or decreasing gradual variation.

12. The circuit for selecting a supply voltage ($VS_j$) according to claim 1, wherein the configuration circuit (CONF) furthermore comprises a circuit (VCMP) for comparing the output supply voltage (VCORE) to a predetermined threshold.

13. The circuit for selecting a supply voltage ($VS_j$) according to claim 1, wherein the configuration circuit (CONF) furthermore comprises a circuit (DEL) for generating a predetermined duration.

\* \* \* \* \*